United States Patent

Arai et al.

[11] Patent Number: 6,064,807
[45] Date of Patent: *May 16, 2000

[54] CHARGED-PARTICLE BEAM EXPOSURE SYSTEM AND METHOD

[75] Inventors: Soichiro Arai; Junichi Kai; Hiroshi Yasuda; Shunsuke Hueki; Yoshihisa Oae, all of Kawasaki, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/653,121

[22] Filed: May 24, 1996

Related U.S. Application Data

[63] Continuation of application No. 08/304,775, Sep. 12, 1994, abandoned.

[30] Foreign Application Priority Data

Dec. 27, 1993 [JP] Japan ................................. 5-333353

[51] Int. Cl.[7] .............................. G06F 17/10; G21C 5/00
[52] U.S. Cl. ................................ 395/500.22; 250/491.1; 250/492.2; 250/492.3; 700/121
[58] Field of Search .......................... 250/491.1, 492.2, 250/492.3, 492.22, 492.23, 398, 396 R, 397, 400; 395/500.22, 500.2, 500.21; 700/121, 160; 430/30, 296, 942

[56] References Cited

U.S. PATENT DOCUMENTS

| | | | |
|---|---|---|---|
| 4,443,703 | 4/1984 | Shimazu et al. | 250/491.1 |
| 4,489,241 | 12/1984 | Matsuda et al. | 250/491.1 |
| 4,523,098 | 6/1985 | Noma | 250/492.2 |
| 4,524,278 | 6/1985 | Le Poole | 250/398 |
| 4,718,019 | 1/1988 | Fillion et al. | 364/491 |
| 4,897,552 | 1/1990 | Okunuki et al. | 250/492.2 |
| 5,086,398 | 2/1992 | Moriizumi | 364/490 |
| 5,134,300 | 7/1992 | Kai et al. | 250/492.2 |
| 5,172,331 | 12/1992 | Yamada | 364/491 |
| 5,180,920 | 1/1993 | Kai et al. | 250/492.2 |
| 5,223,719 | 6/1993 | Takahashi et al. | 250/492.2 |
| 5,225,684 | 7/1993 | Taki et al. | 250/492.2 |
| 5,251,140 | 10/1993 | Chung et al. | 364/474.02 |
| 5,253,182 | 10/1993 | Suzuki | 364/489 |
| 5,329,130 | 7/1994 | Kai et al. | 250/492.22 |
| 5,337,247 | 8/1994 | Hamaguchi | 364/468 |
| 5,343,271 | 8/1994 | Morishige | 355/53 |
| 5,369,282 | 11/1994 | Arai et al. | 250/492.22 |
| 5,404,018 | 4/1995 | Yasuda et al. | 250/492.22 |
| 5,430,304 | 7/1995 | Yasuda et al. | 250/492.22 |
| 5,448,075 | 9/1995 | Fueki et al. | 250/492.22 |
| 5,500,930 | 3/1996 | Fueki | 395/141 |

Primary Examiner—Jacques H. Louis-Jacques
Attorney, Agent, or Firm—Staas & Halsey

[57] ABSTRACT

The present invention relates to an exposure method of a multi-beam type in which a stage mounting a sample to be exposed is continuously moved in a first direction, and charged-particle beams are controlled so as to form a desired beam shape as a whole, and in which a pattern is formed on the sample by deflecting the charged-particle beams by a main deflector and a sub deflector. Patterns to be drawn are divided into pattern data on a cell stripe basis which corresponds to an area which can be exposed when the sub deflector scans the charged-particle beams one time. The pattern data on the cell stripe basis is stored into a memory. Then, position data indicative of cell stripes is stored, in an exposure sequence, together with address information concerning the memory in which the pattern data is stored. The deflection amount data relating to the main deflector and the sub deflector is calculated from the position data. Patterns are drawn on the wafer by using the pattern data and the deflection amount data.

32 Claims, 18 Drawing Sheets

FIG. 13

| DATA | START OF REPETITION | NO. OF REPETITIONS | REPETITION PITCH |
|---|---|---|---|
| Da=RECTANGLE 1, STARTING COORDINATES, SIZE<br>RECTANGLE 2, STARTING COORDINATES, SIZE<br>TRIANGLE 1, STARTING COORDINATES, SIZE<br>. .<br>. . | (Xas, Yas)<br>.<br>.<br>.<br>. | (Xan, Yan)<br>.<br>.<br>.<br>. | (Xap, Yap)<br>.<br>.<br>.<br>. |
| Db=RECTANGLE 1, STARTING COORDINATES, SIZE<br>TRIANGLE 1, STARTING COORDINATES, SIZE<br>TRIANGLE 2, STARTING COORDINATES, SIZE<br>TRIANGLE 3, STARTING COORDINATES, SIZE | (Xbs, Ybs)<br>.<br>.<br>. | (Xbn, Ybn)<br>.<br>.<br>. | (Xbp, Ybp)<br>.<br>.<br>. |
| Drandom 1<br>=RECTANGLE 1, STARTING COORDINATES, SIZE<br>RECTANGLE 2, STARTING COORDINATES, SIZE<br>RECTANGLE 3, STARTING COORDINATES, SIZE<br>TRIANGLE 1, STARTING COORDINATES, SIZE | $\overline{(Xris, Yris)}$<br>.<br>.<br>. | $\overline{(Xrin, Yrin)}$<br>.<br>.<br>. | $\overline{(Xrip, Yrip)}$<br>.<br>.<br>. |
| Drandom 2<br>= . . . . . . . . . . . . . | (Xr2s, Yr2s)<br>.<br>. | (Xr2n, Yr2n)<br>.<br>. | (Xr2p, Yr2p)<br>.<br>. |
| .<br>.<br>. | .<br>.<br>. | .<br>.<br>. | .<br>.<br>. |

FIG. 14

| CELL STRIPE NO. | DATA | START OF REPETITION | NO. OF REPETITIONS | PITCH |
|---|---|---|---|---|
| Csa11 | Da | (XDa1s, YDa1s) | (1, 2) | (XDa1p, YDap) |
| Csa12 | Da | (XDa1s, YDa1s) | (1, 2) | (XDa1p, YDap) |
| Csa13 | Da | (XDa1s, YDa1s) | (1, 2) | (XDa1p, YDap) |
| Csa14 | Da | (XDa1s, YDa1s) | (1, 2) | (XDa1p, YDap) |
| Csa21 | Da | — | — | — |
| Csa22 | Da | — | — | — |
| Csa23 | Da | — | — | — |
| Csa24 | Da | — | — | — |
| Csb11 | Db | (XDb1s, YDb1S) | (4, 3) | (XDb1p, YDb1p) |
| Csb12 | Db | (XDb1s, YDb1S) | (4, 3) | (XDb1p, YDb1p) |
| Csb13 | Db | (XDb1s, YDb1S) | (4, 3) | (XDb1p, YDb1p) |
| Csb21 | Db | (XDb2s, YDb2S) | (4, 3) | (XDb2p, YDb2p) |
| Csb22 | Db | (XDb2s, YDb2S) | (4, 2) | (XDb2p, YDb2p) |
| Csb23 | Db | (XDb2s, YDb2S) | (4, 2) | (XDb2p, YDb2p) |
| Csr1 | TRIANGLE, X1, Y1, X2, Y2<br>RECTANGLE, X1, Y1, X2, Y2<br>BLOCK, X1, Y1, X2, Y2<br>. | — | — | — |
| Csr2 | . . . | | | |
| . . | | | | |

FIG. 15

| CELL STRIPE NO. | COORDINATES OF CELL STRIPE | STARTING ADDRESS OF PATTERN DATA | NO. OF ADDRESSES |
|---|---|---|---|
| Csa11 | (XCsa11, YCsa11) | 1 | 120 |
| Csa12 | (XCsa12, YCsa12) | 1 | 120 |
| Csa13 | (XCsa13, YCsa13) | 1 | 120 |
| Csa14 | (XCsa14, YCsa14) | 1 | 120 |
| Csa21 | (XCsa21, YCsa21) | 121 | 55 |
| Csa22 | (XCsa22, YCsa22) | 121 | 55 |
| Csa23 | (XCsa23, YCsa23) | 121 | 55 |
| Csa24 | (XCsa24, YCsa24) | 121 | 55 |
| Csb11 | (XCsb11, YCsb11) | 176 | 73 |
| Csb12 | (XCsb12, YCsb12) | 176 | 73 |
| Csb13 | (XCsb13, YCsb13) | 176 | 73 |
| Csb21 | (XCsb21, YCsb21) | 249 | 40 |
| Csb22 | (XCsb22, YCsb22) | 249 | 40 |
| Csb23 | (XCsb23, YCsb23) | 249 | 40 |
| Csr1 | (XCsr 1, YCsr 1) | 289 | 62 |
| Csr2 | (XCsr 2, YCsr 2) | 351 | 16 |
| Csr3 | (XCsr 3, YCsr 3) | 367 | 59 |
| . | . | . | . |

CHARGED-PARTICLE BEAM EXPOSURE SYSTEM AND METHOD

This application is a continuation, of application Ser. No. 08/304,775, filed Sep. 12, 1994, now abandoned.

BACKGROUND OF THE INVENTION

1. Field of the Invention

The present invention generally relates to charged-particle beam exposure, and more particularly to charged-particle beam exposure in which charged-particle beams are controlled so as to have a desired beam shape as a whole while a stage mounting a sample is continuously moved and the sample is exposed by a raster scan in which the charged-particle beams are deflected by deflectors.

Recently, integrated circuits have been widely applied to industries such as computers, communications and mechanical controls with improvements in the integration density and functions. For example, the integration density of dynamic random access memories (DRAMs) is drastically increased in the order of 1 Mbits, 4 Mbits, 16 Mbits, 64 Mbits, 256 Mbits and 1 Gbits. Such a drastic increase in the integration density is mainly accomplished by advance in precision production techniques. With an increase in the integration density, an exposure system using a charged-particle beam such as an electron beam has been developed as a means for forming fine patterns. The charged-particle beam exposure is capable of realizing fine production equal to or less than 0.05 µm with a positioning precision of 0.02 µm or less. However, it was considered that the throughput of the charged-particle beam is too low to be practically used to produce LSI devices in commercial quantity. The above consideration is based on a theory of drawing with so-called single-strokes of the electron beam and is not a serious consideration. The above consideration was given taking into account only the currently marketed devices and productivity.

Recently, the inventors have proposed a block exposure method and an exposure method using a blanking aperture array. With these exposure methods, it has been expected to realize a throughput as high as 1 $cm^2$/sec. The proposed exposure methods are superior to the other conventional exposure methods in terms of fine productivity, positioning precision, quick-turn-around performance and reliability.

The proposed exposure methods are required to efficiently process exposure pattern data and improve exposure throughput as in the case of the other conventional exposure methods.

2. Description of the Prior Art

FIG. 1 shows an exposure pattern data process used in a conventional electron beam exposure system which is one of the charged-particle beam exposure systems. For each chip formed on a wafer, an exposure area is partitioned into main deflection fields within each of which an electron beam can be deflected by main deflectors (electromagnetic deflectors). Each of the main deflection fields are segmented into sub deflection fields within each of which the electron beam can be deflected by sub deflectors (electrostatic deflectors). Exposure pattern data is produced for each of the sub deflection fields.

FIG. 2 shows an exposure area segmented into the main deflection fields and the sub deflection fields in the above-described manner. In FIG. 2, areas defined by thick solid lines are the main deflection fields, and areas defined by thin solid lines are the sub deflection fields. As shown in FIG. 2, the main and sub deflection fields are segmented at respective approximately equal intervals.

In the conventional exposure pattern data process shown in FIG. 1, pattern data is produced for each of the sub deflectors, and does not take into account the natures of exposure patterns, such as repetition of exposure pattern at all. For example, it will now be considered that patterns P1 and P2 shown in FIG. 3 are repeatedly drawn by exposure. Data of the patterns P1 and P2 are produced for each sub deflection field. Hence, exposure patterns located on the boundaries between the adjacent sub deflection fields are divided into a plurality of exposure patterns. For example, the pattern P1 located on the right of the illustration is divided into three patterns. This means that the original pattern P1 is drawn by combining the pattern data of the divided exposure patterns. In practice, a so-called margin area is set around each sub deflection field, and pattern located within the margin area is not allowed to be divided. If the pattern P1 is located within a sub deflection field, it is not divided.

As described above, in practice, different pattern data are needed to draw the same patterns, although the same patterns can be originally drawn by single pattern data. It can be seen from the above that the conventional exposure pattern data process does not produce pattern data taking into consideration the repetition of patterns and needs a large amount of data processing. As the amount of pattern data to be processed increases, the time necessary to transfer pattern data increases. This degrades the throughput of the whole system.

Further, it is liable that a positional deviation of the divided parts forming a single pattern may occur because the single pattern is drawn by separately drawing these divided parts.

SUMMARY OF THE INVENTION

It is a general object of the present invention to provide a charged-particle beam exposure system and method in which the above disadvantages are eliminated.

A more specific object of the present invention is to provide a charged-particle beam exposure system and method in which pattern data is processed taking into account a repetition of patterns to be drawn, whereby the amount of data to be processed, the data processing time and data transferring time can be greatly reduced and patterns can be drawn with improved precision.

These objects of the present invention are achieved by an exposure method of a multi-beam type in which a stage mounting a sample to be exposed is continuously moved in a first direction, and charged-particle beams are controlled so as to form a desired beam shape as a whole, and in which a pattern is formed on the sample by deflecting the charged-particle beams by a main deflector and a sub deflector, the exposure method comprising the steps of:

(a) dividing patterns to be drawn into pattern data on a cell stripe basis which corresponds to an area which can be exposed when the sub deflector scans the charged-particle beams one time;

(b) storing the pattern data on the cell stripe basis into a memory;

(c) sorting, in an exposure sequence, position data indicative of cell stripes together with address information concerning the memory in which the pattern data is stored;

(d) calculating deflection amount data relating to the main deflector and the sub deflector from the position data; and (e) drawing patterns on the wafer by using the pattern data and the deflection amount data.

The above objects of the present invention are also achieved by an exposure system of a multi-beam type in which a stage mounting a sample to be exposed is continuously moved in a first direction, and charged-particle beams are controlled so as to form a desired beam shape as a whole, and in which a pattern is formed on the sample by deflecting the charged-particle beams by a main deflector and a sub deflector, the exposure system comprising:

first means for dividing patterns to be drawn into pattern data on a cell stripe basis which corresponds to an area which can be exposed when the sub deflector scans the charged-particle beams one time;

second means for storing the pattern data on the cell stripe basis into a memory;

third means for sorting, in an exposure sequence, position data indicative of cell stripes together with address information concerning the memory in which the pattern data is stored;

fourth means for calculating deflection amount data relating to the main deflector and the sub deflector from the position data; and fifth means for drawing patterns on the wafer by using the pattern data and the deflection amount data.

According to the present invention, patterns to be drawn by exposure are grouped for each cell stripe corresponding to a maximum size which can be exposed during the time when a sub deflector performs scanning one time, and pattern data produced for each cell stripe is stored in a memory. The conventional method divides patterns for each field deflectable by the main and sub deflectors, while according to the present invention, the unit of grouping patterns is the cell stripe having the maximum size which can be exposed while the sub deflector performs scanning one time. That is, pattern data and deflection amount data are produced taking into account the repetitions of patterns, so that the disadvantages encountered in the conventional methods can be eliminated.

BRIEF DESCRIPTION OF THE DRAWINGS

Other objects, features and advantages of the present invention will become more apparent from the following detailed description when read in conjunction with the accompanying drawings, in which:

FIG. 13 is a diagram of a process of converting design data into cell-stripe-basis data;

FIG. 14 is a diagram of a correspondence between each cell stripe and pattern data relating to FIG. 13;

FIG. 15 is a diagram of a process of producing, from the data shown in FIG. 14, data having correspondence with the pattern data memory storing pattern data for each cell stripe;

DESCRIPTION OF THE PREFERRED EMBODIMENTS

An embodiment of the present invention, which will be described below, is an electron beam exposure system of a blanking aperture array (BAA) type which is one of the multi-beam type exposure systems in which charged-particle beams are controlled so as to form a desired beam shape as a whole. The above control is performed by determining whether or not the beams should reach a sample for each beam or by determining whether or not the beams should reach the sample for each group having some beams. In other words, when the blanking aperture array is turned ON, each beam or group including some beams is allowed to pass through the blanking aperture array and reach the sample. When the blanking aperture array is turned ON, each beam or beam group is not allowed to pass through the blanking aperture array. The above ON/OFF control depends on a pattern to be drawn. During exposure, a stage on which the sample is mounted is continuously moved in a first direction, and the electron beams are deflected so as to run substantially straight in the first direction or a second direction orthogonal to the first direction by means of one or a plurality of deflectors.

As is known in the art, the blanking aperture array includes groups arranged in a zigzag formation. Each of the groups includes an aperture and a pair of electrodes located on opposite sides of the aperture. One of the pair of electrodes is set to the ground potential, and the other electrode is selectively set to either the ground potential or a predetermined potential in order to control the trajectory of the electron beam passing through the corresponding aperture. The electron beams passing through the blanking aperture array are controlled so that it is determined whether or not these beams should be allowed to pass through an aperture of an aperture plate located at the downstream side in an optical lens-barrel. The voltages applied to the electrodes of the blanking aperture array are controlled in synchronism with the raster scan of the sub deflectors, a pattern is drawn in the belt-shaped area corresponding to the cell stripe.

Figure 4:
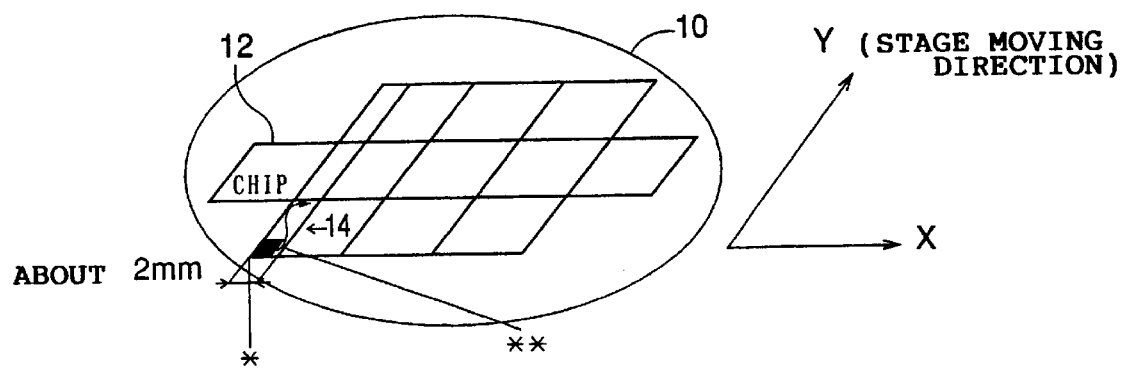
FIG. 4 is a diagram of a scanning method according to an embodiment of the present invention.

A description will first given of the scan used in the embodiment of the present invention. FIG. 4 shows a wafer 10, on which a plurality of chips 12 are formed. During exposure, the wafer 10 is continuously and repeatedly moved in the Y direction. The scan of the electron beam is performed on the cell area base. A reference number 14 indicates one cell area. The cell area has a size in the X-direction which corresponds to a field (for example, 2 mm) deflectable by the main deflector and a length in the Y direction which corresponds to the size of one chip. In the example shown in FIG. 4, the size of the cell area in the Y direction is equal to the size of one chip 12. The electron beams are deflected so as to move in the Y direction while moving zigzag in the X direction (swinging in the X direction). In principle, there is no need to define the size of the cell area in the Y direction because the stage is continuously moved in the Y direction. However, it is practically preferable that the cell area has a limited size in the Y direction in terms of various correction operations and the efficiency in data processing. In this case, it is desired that the size of the cell area in the Y direction be as long as possible. For example, the size of the cell area in the Y direction is equal to the chip size. When it is desired that the correction operations be performed more precisely, it is preferable that the size of the cell area in the Y direction is set less than the chip size.

Now, a cell stripe will be defined. The cell stripe has an area equal to a field which can be scanned one time by the sub deflector or less than the field. For example, when the sub deflector has a maximum deflectable area equal to approximately 100 $\mu$m and the blanking aperture array has a width of approximately 10 $\mu$m, the cell stripe is approximately 10 $\mu$m wide in the X direction and approximately 100 $\mu$m long in the Y direction.

Figure 5:
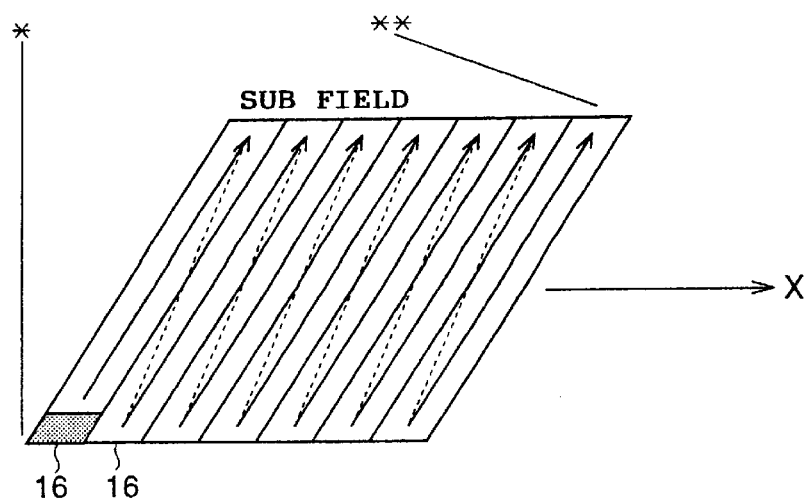
FIG. 5 is an enlarged perspective view of the scanning method shown in FIG. 4.

FIG. 5 is an enlarged perspective view of the area filled with black and indicated by symbols "*" and "**" shown in FIG. 4. As shown in FIG. 5, the electron beams are moved in the X directions while scanning the electron beam in the Y direction for each cell stripe 16. In the case where each of the cell stripes has a maximum size of 10 $\mu$m×100 $\mu$m, the sub deflector scans an area including 10 cell stripes arranged in the X direction. Hence, the sub deflection field is equal to an area of approximately 100 $\mu$m×100 $\mu$m. The cell area 14 scanned by the main deflector corresponds to the area having a width of approximately 2 mm in the X direction and a length in the Y direction deflectable when continuously moving the stage.

The size of the cell stripes 16 is variable but limited to a maximum size of 10 $\mu$m×100 $\mu$m. The method of varying the size of the cell stripes 16 is as follows. The size of the blanking aperture array is fixed. With the above in mind, in order to reduce the width of the cell stripes 16 in the X direction, apertures located in the end portions of the blanking aperture array are always maintained in the OFF state so that the electron beams cannot pass through these apertures. In order to reduce the length of cell stripes 16 in the Y direction, the scanning length is reduced or OFF-data is used instead of data other than data about the cell stripes 16 with the scanning length fixed to a contact value.

More particularly, the size of the cell stripes 16 is selected so as to match the pitch of repetition of a pattern having a repetition.

Figure 1:
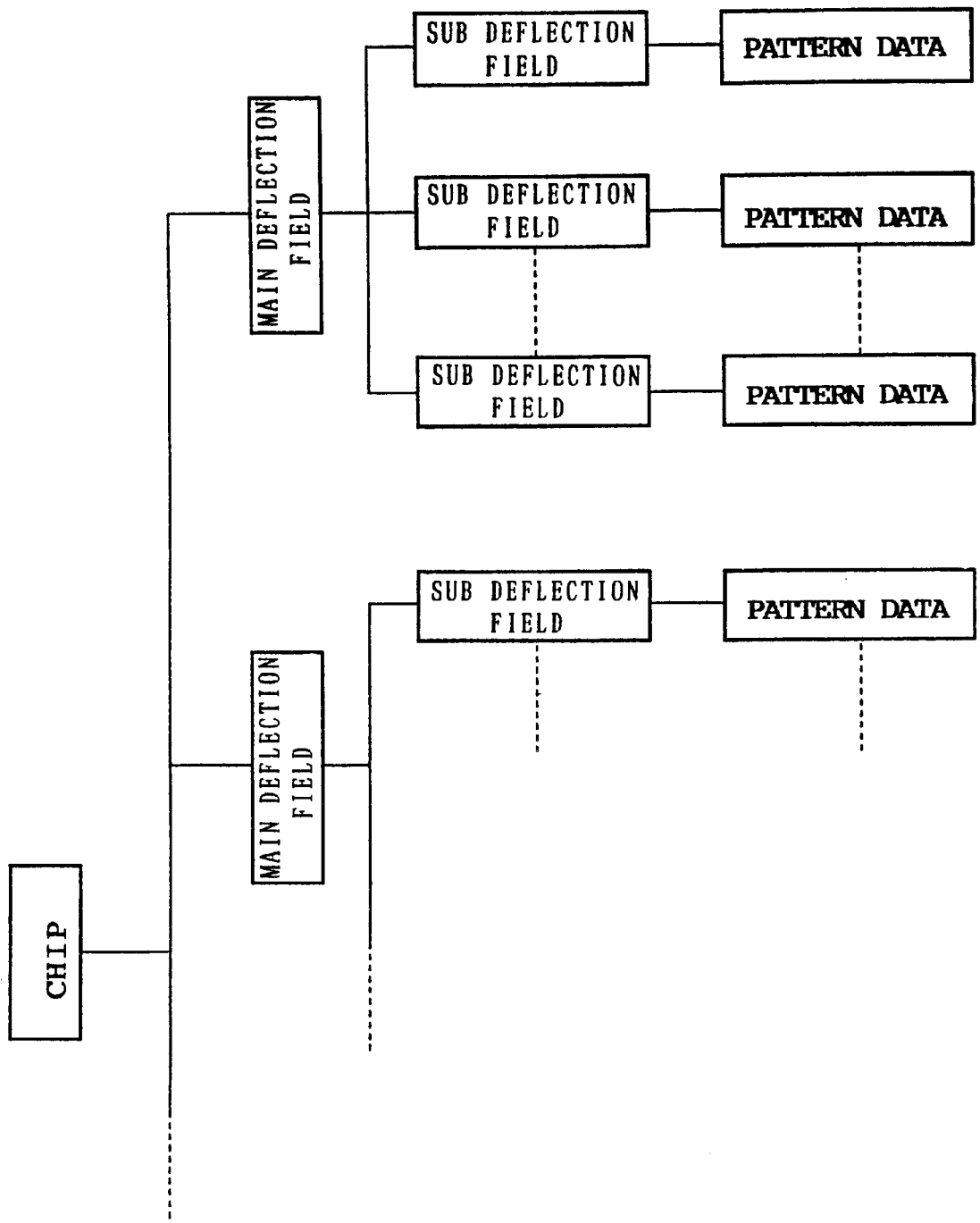
FIG. 1 is a diagram of a conventional exposure pattern data process.
Figure 2:
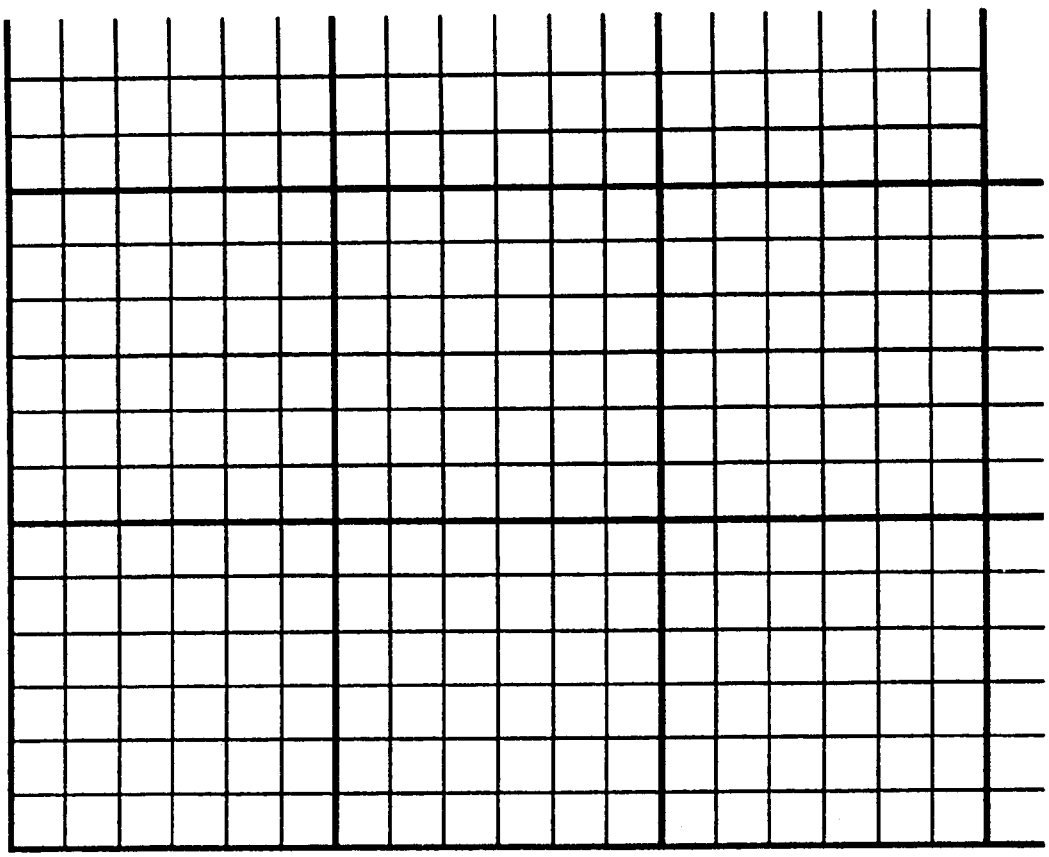
FIG. 2 is a diagram of fields on a wafer deflectable by a main deflector and a fields thereof deflectable by a sub deflector.
Figure 3:
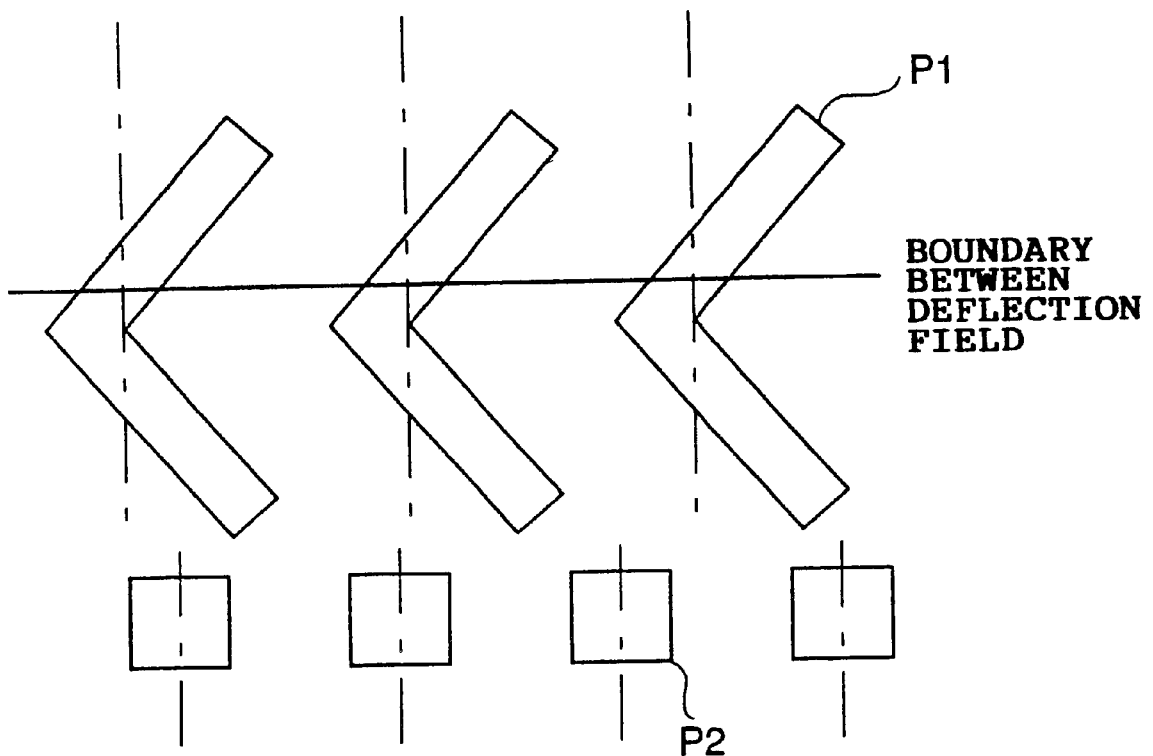
FIG. 3 is a diagram of a conventional pattern data producing method.
Figure 6:
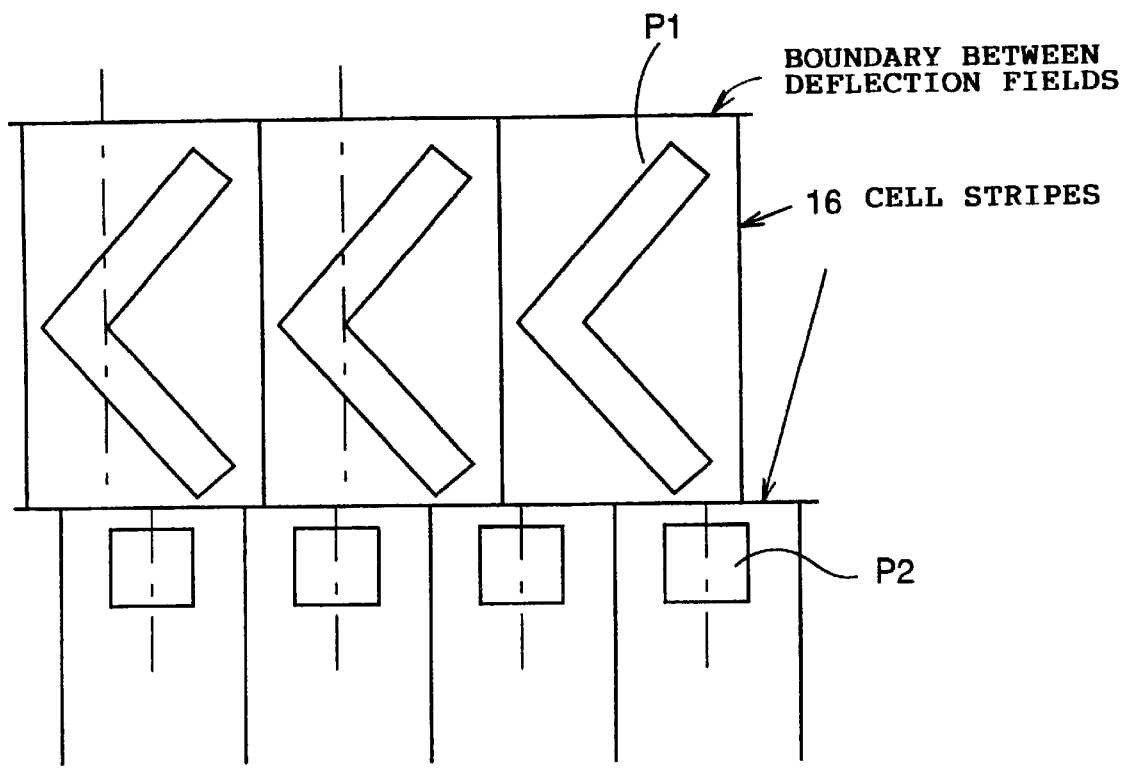
FIG. 6 is a diagram of a method of dividing patterns into patterns on a cell stripe basis according to the embodiment of the present invention.

FIG. 6 shows patterns P1 and P2 (which have been described previously with reference to FIG. 3) for which cell stripes 16 having different sizes are defined. The cell stripes 16 are defined so as to match the pitches of the arrangements of the patterns P1 and P2. When drawing the patterns P1, it is sufficient to refer to single pattern data forming the patterns P1 for each of the cell stripes 16. In other words, it is sufficient to prepare single pattern data forming the patterns P1 used in common to the cell stripes 16 defined for the patterns P1. Hence, it is possible to reduce the amount of pattern data, as compared with the prior art shown in FIG. 3.

Figure 7:
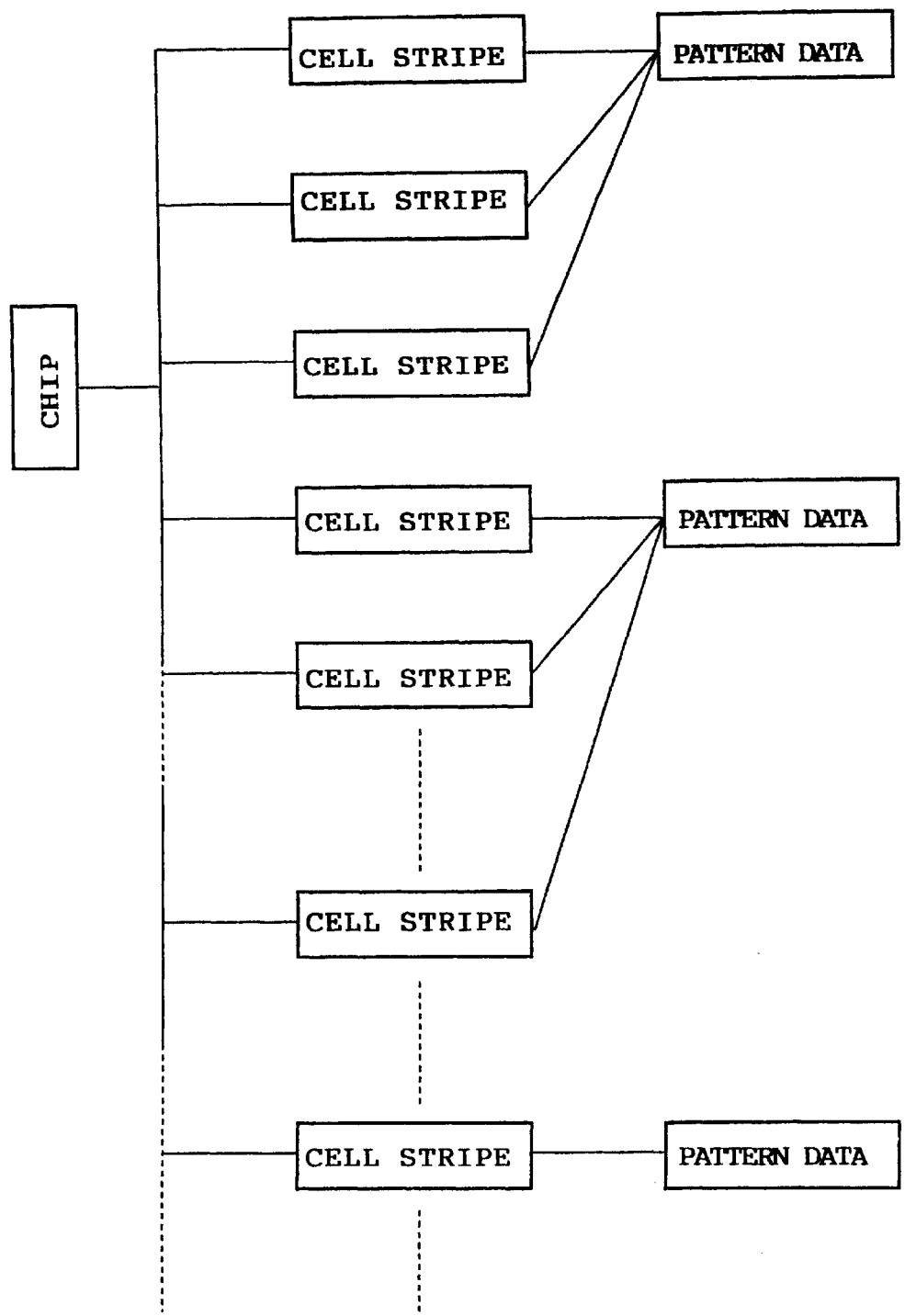
FIG. 7 is a diagram of a process of producing pattern data according to the embodiment of the present invention.

FIG. 7 shows formation of pattern data according to the embodiment of the present invention being considered. As shown in FIG. 7, patterns to be drawn on the chip by exposure are grouped into cell stripes, and data concerning identical patterns commonly included in cell stripes is set in common to these cell stripes. Hence, according to the embodiment of the present invention, it is possible to reduce a possibility that patterns are divided at the boundaries of the sub deflection fields as in the case shown in FIG. 3 and to improve data compression since single pattern data indicating identical patterns is commonly set to cell stripes.

Figure 8:
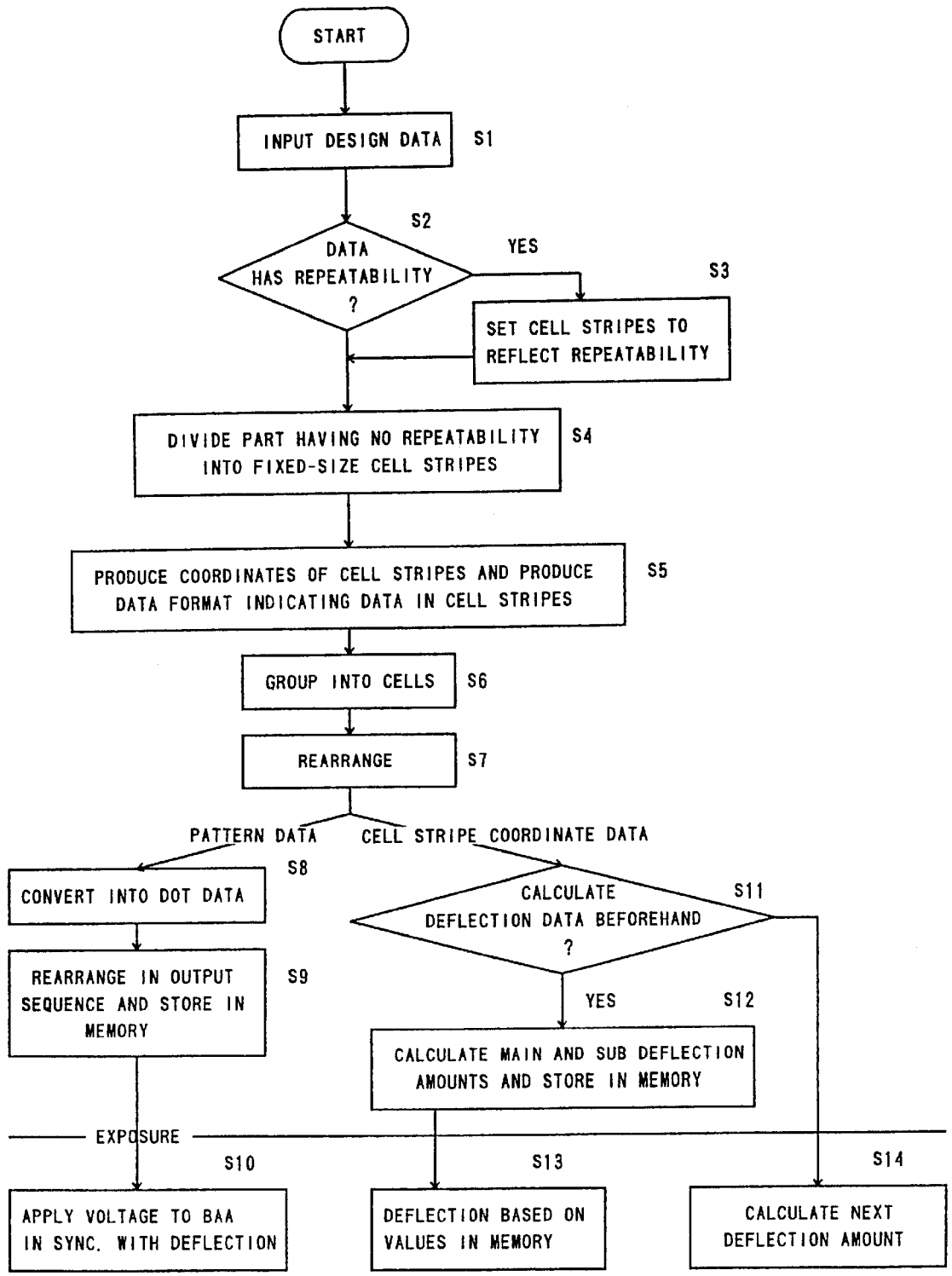
FIG. 8 is a flowchart of a data processing sequence according to the embodiment of the present invention.

FIG. 8 is a flowchart of a data process executed in the exposure system according to the embodiment of the present invention. As will be described later, steps S1 through S14 shown in FIG. 8 are executed by a data processing computer (CAD), an exposure process control/operation device and a control part of an exposure apparatus in the exposure system.

In step S1, design data is input to the data processing computer, which will be described in detail later. The design data is a group of items of pattern data. Each item of pattern data includes information indicating the shape of a pattern, beginning coordinates and the size of the pattern. In step S2, it is determined whether or not the design data has a repetition of pattern data. As will be described later, the design data is grouped within a size processible by the cell stripe and the above determination is carried out. In step S3, the cell stripes are set to pattern data having a repetition. In step S4, cell stripes having a fixed size (equal to, for example, the aforementioned maximum size) is set to pattern data having no repetition.

In step S5, coordinate data of each of the cell stripes thus defined and pattern data for each of the cell stripes are produced and stored in a table. It will be noted that there are pattern data having a repetition and pattern data having no repetition. The pattern data having a repetition is stored as pattern data common to the cell stripes having the pattern drawn by the above pattern data.

Figure 9:
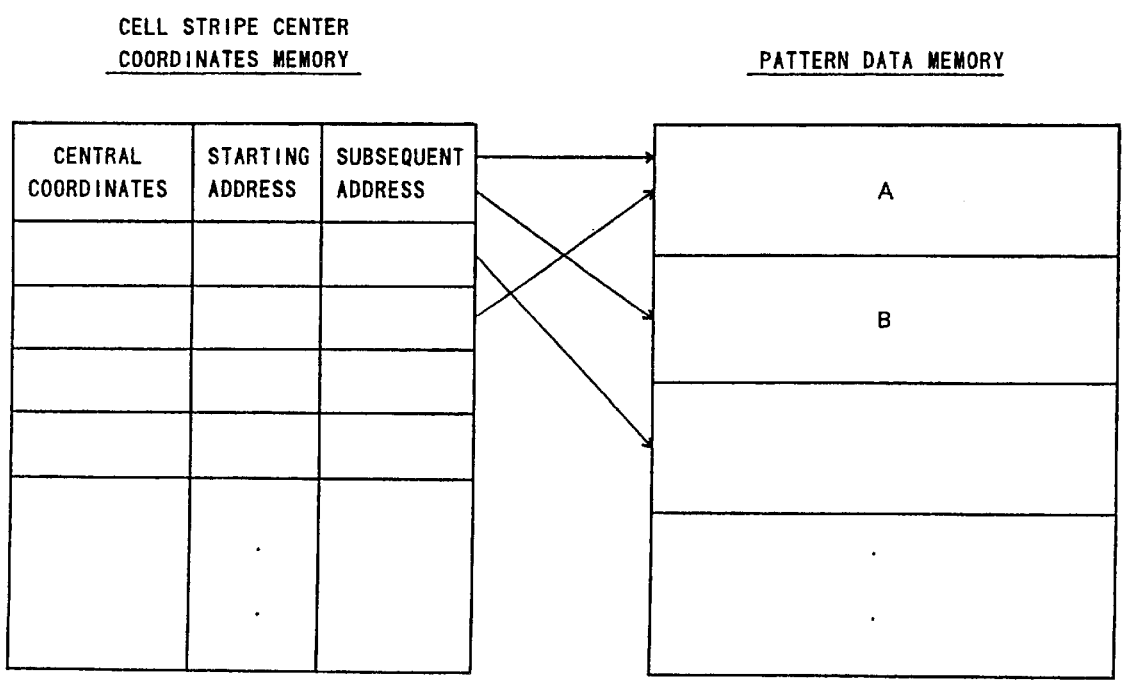
FIG. 9 is a diagram of an example of the storage contents of a cell stripe center coordinates memory and a pattern data memory used in the embodiment of the present invention.

FIG. 9 shows an example of the above procedure. As shown in FIG. 9, different pattern data A and B are stored in a pattern data memory provided in the system, and the coordinates data is stored, for each cell stripe, in a cell stripe center coordinates memory provided therein. The coordinate data includes data indicating the center coordinates of the cell stripe, the starting address of the corresponding pattern data stored in the pattern data memory, and the number of addresses starting from the starting address and corresponding to the area in which the pattern data is stored.

In step S6, the cell stripes are grouped on the aforementioned cell area base. In subsequent step S7, the cell stripe coordinates data are rearranged for each cell area so that the cell stripes are arranged in the sequence of scan described with reference to FIG. 4 (sort process).

Figure 10:
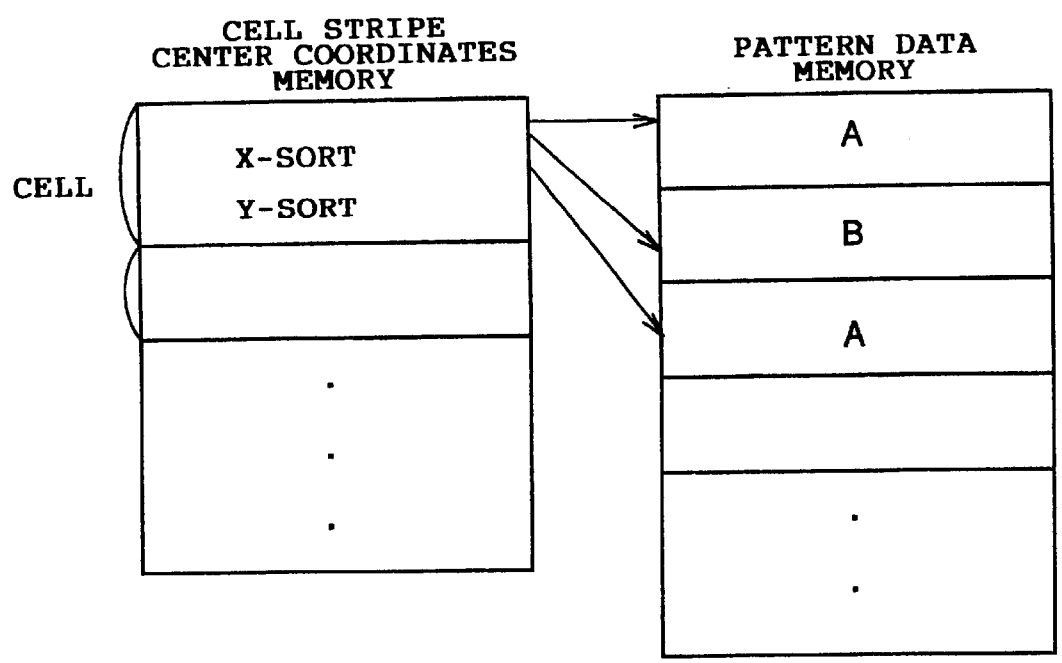
FIG. 10 is a diagram of a sorting process according to the embodiment of the present invention.

FIG. 10 shows the rearrangement of step S7. For each cell area, the grouped cell stripes are rearranged in the exposure sequence. In the example shown in FIG. 10, the exposure process on the patterns A, B and A is carried out in this order.

In step S8, the pattern data stored in the pattern data memory is converted into dot data (bit data) for each cell stripe. As has been described previously, in the exposure system of the blanking aperture array type, a pattern is drawn by a group of fine beams produced by the blanking aperture array. Hence, binary information indicating ON/OFF is applied to the blanking aperture array. For this reason, the pattern data is converted into dot data to thereby form a bit map. In step S9, the dot data produced in step S8 are rearranged in the output order, and the rearranged dot data are stored in the memory. The dot data stored in the memory are applied to the blanking aperture array in synchronism with the deflecting operation in step S10.

Deflection amount data indicating the amounts of deflection by the main and sub deflectors is calculated from the coordinates data of the cell stripes sorted in step S7. In this calculation, it is determined in step S11 whether or not the deflection amount data should be calculated before starting the exposing operation. When the result of the step S11 determination is NO, the deflection amount data about an exposure area which will be exposed in the near future when another exposure area is being exposed. For example, a cell area is being exposed as shown in FIG. 4, the deflection amount data related to the next cell area is calculated. Alternatively, it is possible to produce the deflection amount data related to cell stripes used during the next scan (the direction opposite to the arrow shown in FIG. 5) while the linear scan is being performed. The deflection amount data thus produced is temporarily stored in the memory. When the next cell area (or the next X-direction scan) is performed, the deflection amount data temporarily stored in the memory are read therefrom, and are applied to the main and sub deflectors. For each cell stripe, it is possible to calculate the deflection amount data of the next cell stripe while the cell stripe proceeding to the above next cell stripe is being exposed.

When the result of the step S11 determination is YES, in step S12, the amount of deflection for each cell area is calculated and stored in the memory. When exposing the wafer, in step S13, the deflection amount data stored in the memory beforehand are read therefrom and are applied to the main and sub deflectors.

A description will now be given of the sort process executed in step S7 and the production of the deflection amount data performed in step S12 or S14.

Figure 11:
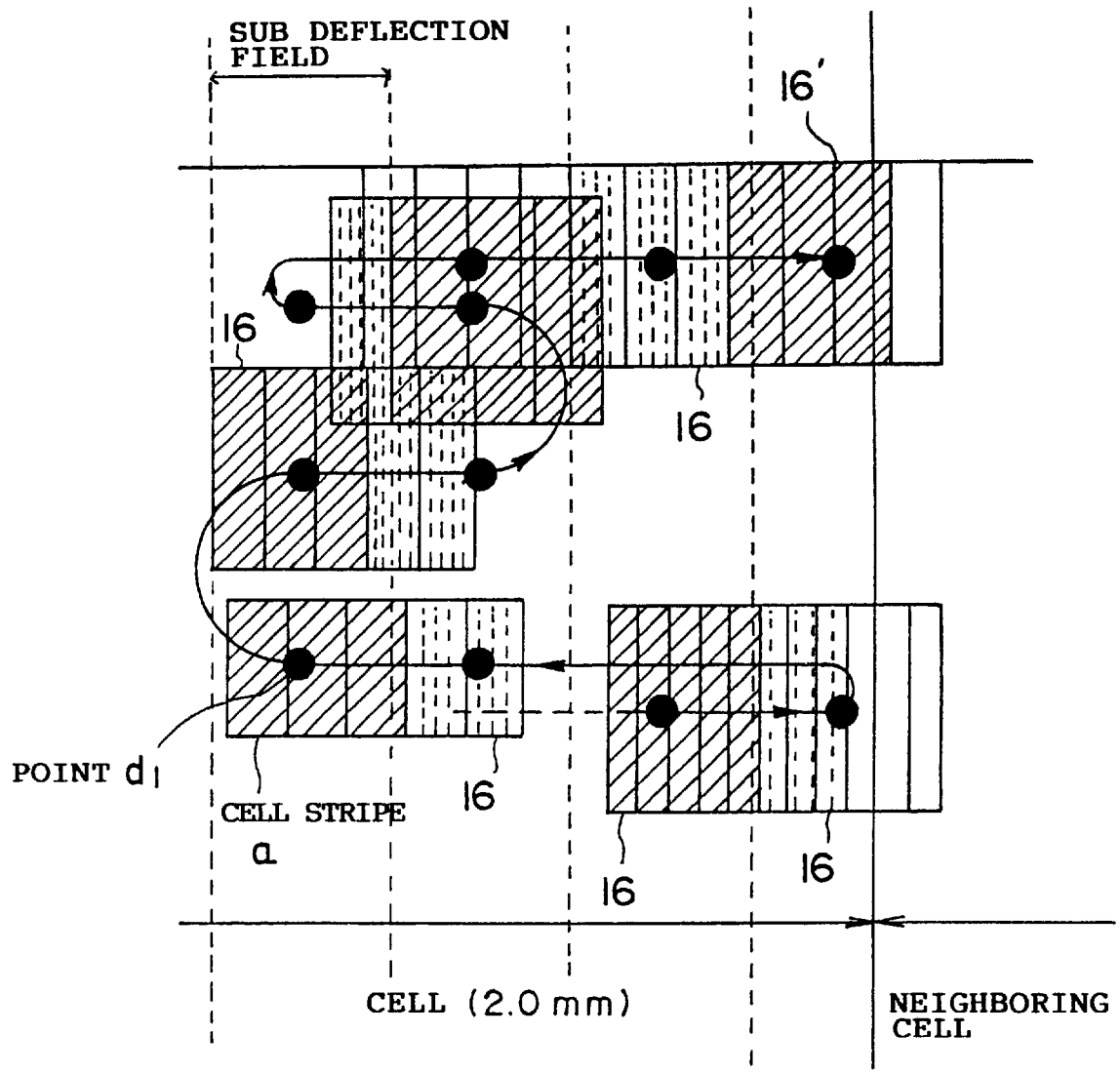
FIG. 11 is a diagram of an electron beam scanning method according to the embodiment of the present invention.

FIG. 11 is a diagram of a part of a cell area. As has been described with reference to FIGS. 4 and 5, the electron beams are moved in the Y direction by means of the movement of the stage while the beams are moved zigzag in the X direction. In FIG. 11, the solid line having arrow heads indicates the scan by the electron beams. Longitudinal rectangular areas shown in FIG. 11 correspond to the cell stripes 16. The cell stripes 16 provided with the same hatching have identical patterns having a repetition. Each of the cell stripes 16 has a maximum size of 10 $\mu$m×100 $\mu$m. The cell stripes 16 have different sizes in the X and/or Y direction on the basis of the patterns having repetitions.

After the coordinate data and the pattern data are grouped for each cell area in step S6, in step S7, the position (coordinates) of each cell stripe from the center of the cell area is calculated by using the following expression:

$$X = xi - xc$$

$$Y = yi - yc$$

where xi and yi denote the coordinates of the cell stripe with respect to the chip center, and xc and yc are the coordinates denote the coordinates of the center of the cell area. Hence, X and Y denote the coordinates of the cell stripe from the center of the cell area.

In order to simplify the explanation, the following description relates to a case where the sub deflection fields are divided in only the X direction. It is possible to employ a method in which the sub deflection fields are divided in the Y direction (in this case, it is necessary to set the divided area size to be less than that in the X direction due to a deflection limit of the sub deflector), and close cell stripes are successively exposed.

Then, for each cell area, the cell stripes are sorted according to the values of the Y coordinate obtained in the above manner. Subsequently, the cell stripes which have been sorted according to the values of the Y coordinate are sorted according to the values of the X coordinate so that the zigzag scan shown in FIG. 11 can be performed.

In step S12 or S14, the deflection amount data of the main deflector is produced. For this production, the cell area is equally divided, in the X direction, into parts having the size of the sub deflection fields. Regarding the Y direction, only cell stripes having the same Y coordinate are included in a sub deflection field. That is, even in a case where cell stripes overlap in almost the same positions, different sub deflection fields are defined if the Y coordinate values of these cell stripes are different from each other, and the electron beams are deflected in the different positions in the Y direction by means of the main deflector. Hence, it is possible to permit overlapping of cell stripes.

The deflection position by the main deflector can be obtained by the following expression:

$$xm = [(|X| + (\text{sub deflection field size})/2) / (\text{sub deflection field size})] \times (\text{sub deflection field size})$$
$$(\text{where } xm < 0 \text{ for } X < 0, xm > 0 \text{ for } X > 0)$$
$$ym = Y$$

In step S12 or S14, data indicating the deflection position of the sub deflector is calculated. The sub deflector deflects the electron beams in the X direction and the Y direction after the electron beam is deflected by the main deflector. As has been described previously, according to the present invention being considered, the maximum size of the cell stripes is equal to 10 $\mu$m×100 $\mu$m, and therefore a maximum margin of 5 $\mu$m on either side in the X direction is set. For example, a cell stripe 16' shown in FIG. 11 partially extends to the neighboring cell area. When the extending portion of the cell stripe 16' is present within the above margin, this portion is located within the cell stripe of the cell area being considered and can be drawn by scan in the X direction by means of the sub deflector. The length of the cell stripe can be scanned in the Y direction by the sub deflector. Hence, the deflecting position (xs, ys) by the sub deflector can be defined as follows:

$$xs = X - xm + xscan$$

$$ys = yscan$$

where xscan and y scan respectively denote sub-deflecting positions within the sub deflection field.

Exposure is carried out on the basis of the deflection amount data to be applied to the main deflector, the deflection amount data to be applied to the sub deflector and the dot data obtained in steps S8 and S9.

A description will now be given of the data process shown in FIG. 8 by referring to a concrete example.

Figure 12:
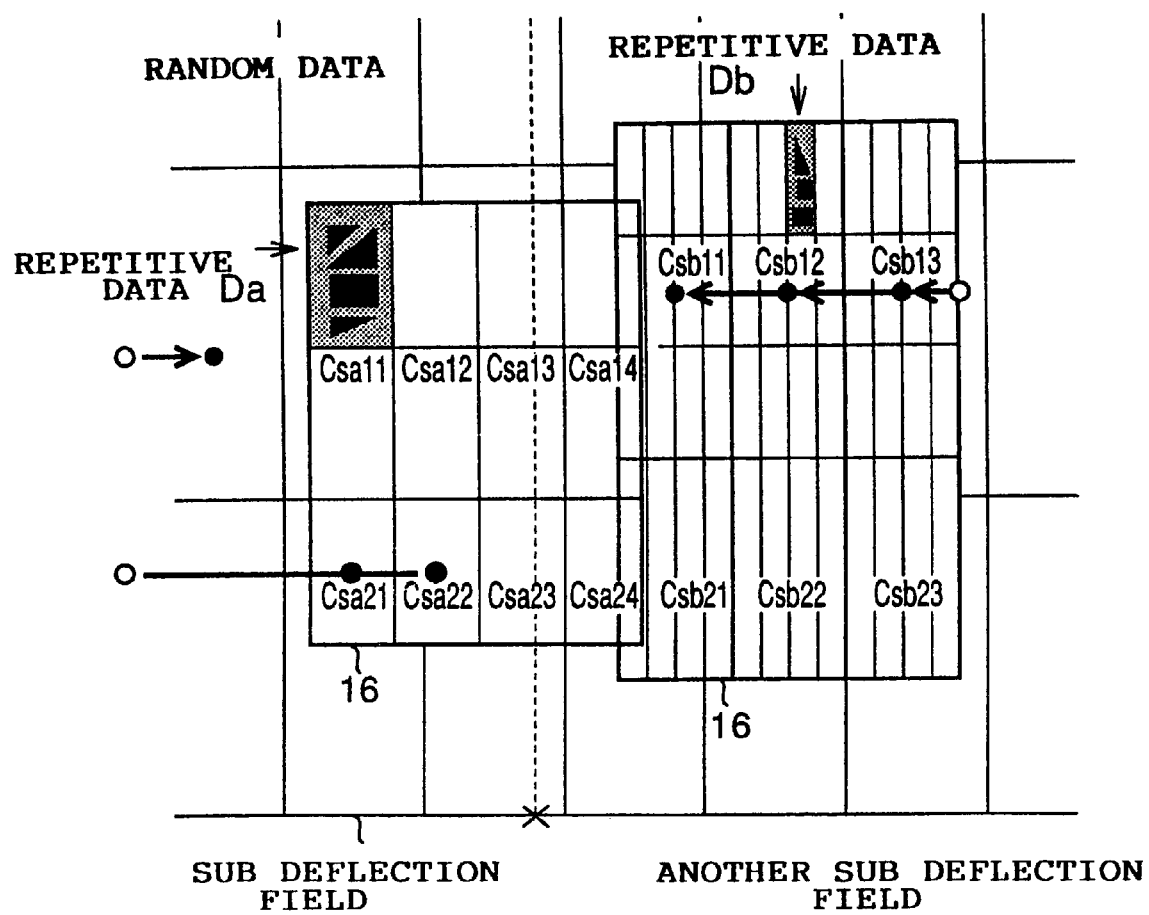
FIG. 12 is a diagram of an example of patterns to be processed in the embodiment of the present invention.

FIG. 12 is a diagram of set data of a pattern to be drawn on the chip. The example shown in FIG. 12 includes repetitive pattern data Da and Db having respective repetitions and random pattern data having no repetition.

In the design data input to step S1 (FIG. 8), repetitive pattern data is a group of pattern data indicating patterns having repetitions. For example, as shown in FIG. 13, the repetitive pattern data Da shown in FIG. 12 includes the shapes of patterns (rectangle 1, rectangle 2, triangle 1, etc.), the starting coordinates of the patterns, and data regarding the sizes of the patterns. The repetitive pattern data Db contains the same data as the repetitive pattern Da. Similarly, the pattern data having no repetition (in FIG. 13, Drandom 1, Drandom 2) includes the shapes, starting coordinates and sizes of patterns having no repetition.

The data processing computer receiving the above-mentioned design data determines, in step S2 (FIG. 8), whether or not the design data contains data relating to repetitions. In step S3, the data processing computer groups pattern data having repetitions within a size handled by the cell stripe. For example, regarding the repetitive pattern data Da, four patterns (one rectangle and three triangles) are gathered as a group of patterns that can be handled as one cell stripe 16. Similarly, regarding the repetitive pattern data Db, three patterns (two rectangles and one triangle) are gathered as a group of patterns that can be handled as one cell stripe 16. The pattern data grouped in the above manner is stored in a table within the system as shown in FIG. 13. As shown in FIG. 13, for each repetitive pattern data, the table stores data regarding the starting coordinates of the repetition, the number of repetitions and the pitch of the repetition. For example, rectangle 1 of the pattern data Da is repeatedly drawn under a condition of the starting point (Xas, Yas), the number of repetitions (Xan, Yan) and pitch (Xan, Yan).

Regarding the random pattern having no repetition (Drandom1 and Drandom2 shown in FIG. 13), the cell stripes are defined by dividing the area into portions of a definite size without taking into consideration the states of the areas in which the random patterns exist. As shown in FIG. 12, if there are cell stripes overlapping each other, another cell stripe is defined for the above overlapping portion so as to avoid the overlapping of the cell stripes. If at least two of a first pattern having a repetition, a second pattern having a repetition with a repetition pitch different from that of the first pattern, and a pattern having no repetition overlap, it is possible to set a cell stripe including the overlapping portion. Further, a pattern frequently used is extracted as a block pattern, and the number of the pattern is handled in the same manner as that of an ordinary pattern. At the stage shown in FIG. 13, the coordinates of the patterns indicate the positions with respect to the center of the chip. The pattern data is represented using a format having a fixed length.

In step S5, a table as shown in FIG. 14 is produced from the table shown in FIG. 13. The table shown in FIG. 14 shows the correspondence between the coordinates of the cell stripes and the pattern data included in the cell stripes. In FIG. 14, the cell stripe number (NO) corresponds to the coordinates of the cell stripe, and the pattern data contains data indicating the patterns included in the cell stripe, data indicating the starting point of the repetition, data indicating the number of repetitions, and data indicating the pitch of the repetition. The bigger the size of the cell stripe, the higher the throughput. With the above in mind, as in the case of data Da or Db, if a plurality of patterns are present in one cell stripe, the size of the group of data is rearranged by referring to a data structure of the data processing computer (CAD) so that the rearranged cell stripe contains two data Da and 12 data Db.

Hence, as shown in FIG. 14, the cell stripes Csa11 through Csb23 are rearranged so that groups of data Da and Db having respective sizes equal to multiples of the data structure unit are formed. In the data process in the exposure apparatus a formation such that a repetition of data is expressed in a repetition formation is not allowed. Hence, the pattern data is edited so as to be changed to data at a level represented by pattern data and its repetition. The result of the above process corresponds to the structure shown in FIG. 7 made up of the cell stripes and pattern data. The cell stripes Csr1, Csr2 and so on do not have repetitions, only the pattern data within Drandom1 (a repetition of pattern data may exist) is divided.

After producing the table shown in FIG. 14, a table shown in FIG. 15 is produced. The table shown in FIG. 15 corresponds to the contents of storage of the cell stripe center coordinates memory shown in FIG. 9 described previously. For each cell stripe, data is generated, which indicates the center coordinates of the cell stripe, the starting address of the pattern data memory in which the pattern data is stored and the number of addresses (to be successively read starting from the starting address). In the example shown in FIG. 15, the pattern data memory stores pattern data to be drawn in the cell stripes Csa11 through Csa14 (pattern Da is repeated in the Y direction twice) in a storage area equal to 120 successive addresses starting from address 1. Further, the pattern data memory stores pattern data to be drawn in the cell stripes Csa21 through Csa24 in a storage area equal to 55 consecutive addresses starting from address 121.

After producing the table shown in FIG. 15, the sort process is carried out in step S7 shown in FIG. 8 and FIG. 10 so that the cell stripes are arranged in the exposure order. Thereafter, the main deflection amount data and the sub deflection amount data with respect to the center coordinates of the cell stripe are produced in step S12 or S14 shown in FIG. 8.

Figure 16:
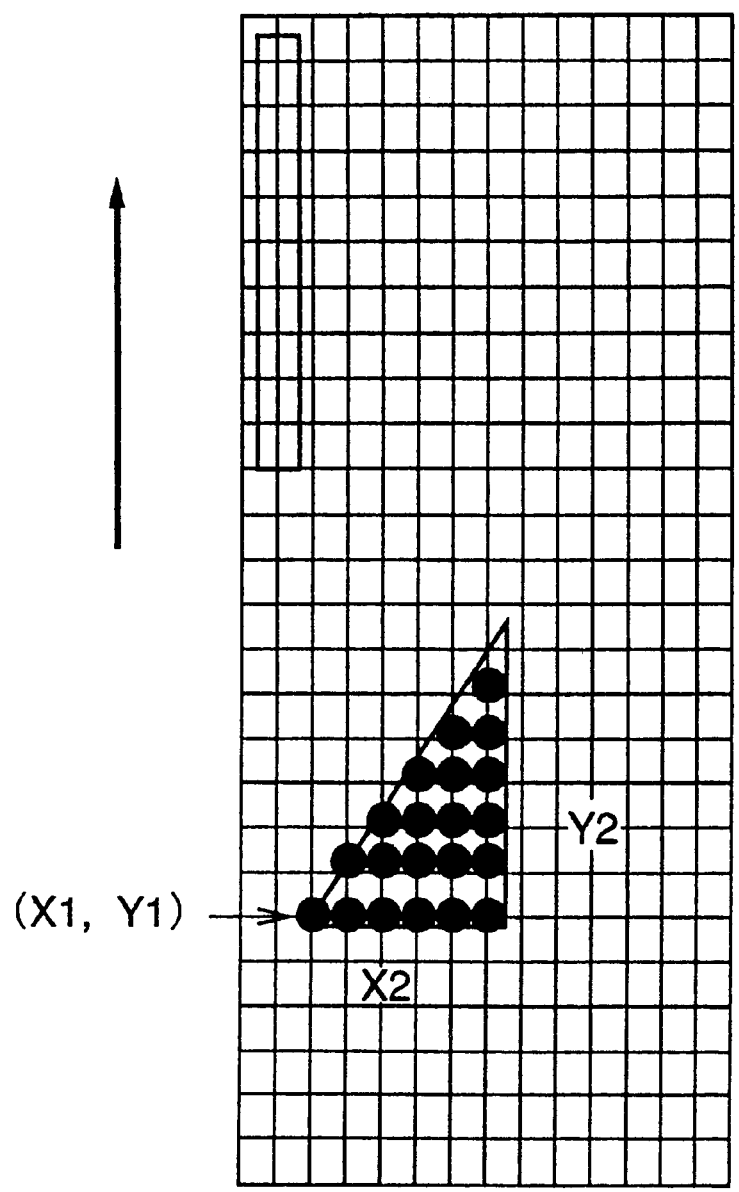
FIG. 16 is a diagram of a process of converting pattern data into dot (bit) data.

The pattern data having repetitions such as Da and Db and the block pattern data are converted into dot data (bit data) for each cell stripe, and the dot data is stored in the bit map memory. For example, as shown in FIG. 16, bits specified by the pattern data read from the pattern data memory are changed to "1" in a memory (canvas memory) having a capacity such that the size of the cell stripe can be expressed on the 0.01 $\mu$m base. If a triangle has a starting point (X1, Y1) and a size (X2, Y2), dot data is stored in the canvas memory as shown in FIG. 13. Normally, the canvas memory is configured so that the transverse direction (X direction) thereof matches the direction of a data sequence. The scan at the time of exposure is carried out in the direction indicated by the arrow shown in FIG. 16. Hence, data with respect to one aperture of the blanking aperture array has an arrangement in the longitudinal direction orthogonal to the transverse direction. Hence, the data sequence in the transverse direction is rearranged to a data sequence in the longitudinal direction and is then stored in the bit map memory. At the time of exposure, the data sequence in the longitudinal direction is read from the bit map memory, and is output to the blanking aperture array.

By using the main deflection amount data, the sub deflection amount data and the dot data produced in the above-mentioned manner, patterns are sequentially drawn by exposure, as shown in FIG. 12. In the exposure operation, patterns having different values of the Y coordinate are drawn by deflecting the electron beams by the main deflector on the basis of the main deflection amount data in the zigzag formation and by positioning the electron beams at the center of an area indicated by a dot line. Then, the electron beams are deflected by an amount indicated by the arrow shown in FIG. 12 by means of the sub deflector which receives the sub deflection amount data. In FIG. 12, the symbol "○" indicates the main deflector deflecting position, and symbol "•" indicates the center of each cell stripe deflected by the sub deflector.

Figure 17:
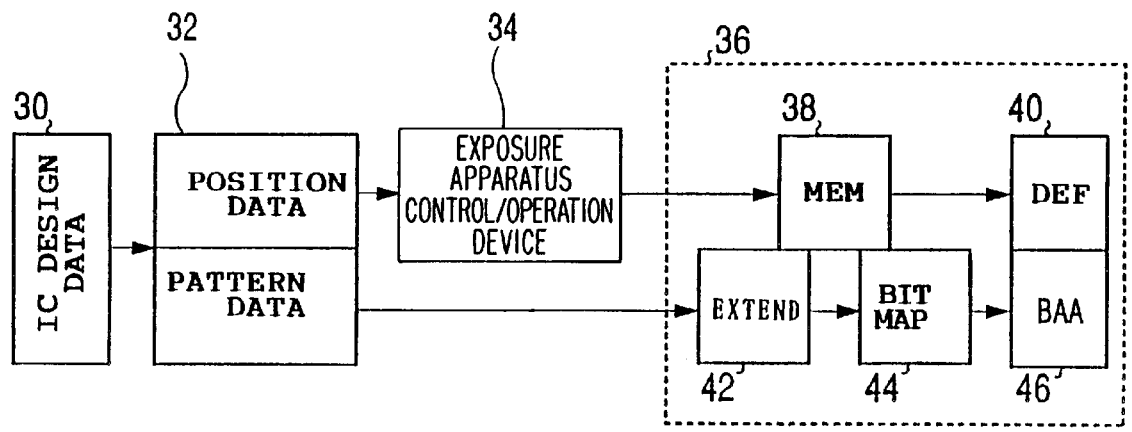
FIG. 17 is a block diagram of an example of the structure of the charged-particle beam exposure system according to the present invention.

FIG. 17 is a block diagram of an example of the structure of a charged-particle beam exposure system according to the present invention. The exposure system shown in FIG. 17 is made up of a data processing computer 32, an exposure apparatus control/operation device 34 and an exposure apparatus 36. The data processing computer 32 receives IC design data 30 and executes the steps S1 through S7 shown in FIG. 8, and transfers data indicating pattern data and the position (coordinates) thereof obtained for each cell stripe to the exposure apparatus control/operation device 34. The exposure apparatus control/operation device 34 executes the steps S11 and S12 shown in FIG. 8. That is, the device 34 calculates the deflection amount data (main deflection amount data and the sub deflection amount data) indicating the amounts of deflection from the received position data for each cell stripe, and transfers the calculated the deflection amount data to the exposure apparatus 36. A deflection memory 38 of the exposure apparatus 36 receives the deflection amount data from the exposure apparatus control/operation device 34, and outputs it to a deflector 40 after a temporary storage. The pattern data produced by the data processing computer 32 passes through the exposure apparatus control/operation device 34, and is transferred to a data extension device 42 of the exposure device 36 (or the pattern data is directly transferred to the exposure apparatus 36 without passing through the exposure apparatus control/operation device 34). The data extension device 42, which executes the steps S8 and S9, stores the dot data (bit data) in a bit map memory 44 built in the exposure apparatus 36. The dot data is read from the bit map memory 44, and is output to a blanking aperture array (BAA) 46.

As described above, all deflection amount data is calculated before starting the exposure, and is stored in the deflection amount memory 38 beforehand.

Figure 18:
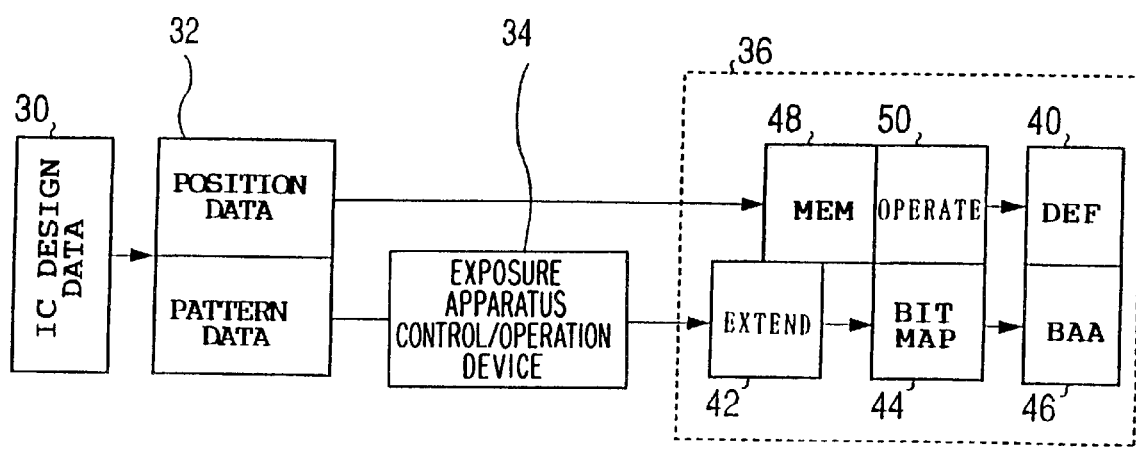
FIG. 18 is a block diagram of another example of the structure of the charged-particle beam exposure system according to the present invention.

FIG. 18 is a block diagram of another structure of the charged-particle beam exposure system according to the present invention. In FIG. 18, parts that are the same as those shown in FIG. 14 are given the same reference numbers. In the structure shown in FIG. 18, the position (coordinates) data of each cell stripe produced by the data processing computer 32 is directly transferred to a cell stripe memory 48 of the exposure apparatus 36 (that is, the position data bypasses the exposure apparatus control/operation device 34). A deflection amount calculator 50 in the exposure apparatus 36 reads the position data from the cell stripe memory 48, and calculates the deflection amount data in step S14 shown in FIG. 8. More particularly, for example, the deflection amount data regarding the next cell stripe is calculated in a pipeline formation synchronized with the exposure while the previous cell stripe is being subjected to the exposure. The calculated deflection amount data is output to the deflector 40. The pattern data produced by the data processing computer 32 is transferred to the exposure apparatus control/operation device 34, and is transferred to the data extension device 42 at a predetermined timing after a temporary storage.

In the exposure system shown in FIG. 18, the necessary deflection amount data is calculated in real time while performing the exposure. Hence, it is not necessary to calculate all position (coordinates) data necessary for the exposure beforehand, with the result that the system shown in FIG. 18 is simpler than shown in FIG. 17.

The pattern data produced by the data processing computer 32 may be compressed and output by a conventional data compression method. In this case, the data extension device 42 expands the compressed pattern data.

Figure 19:
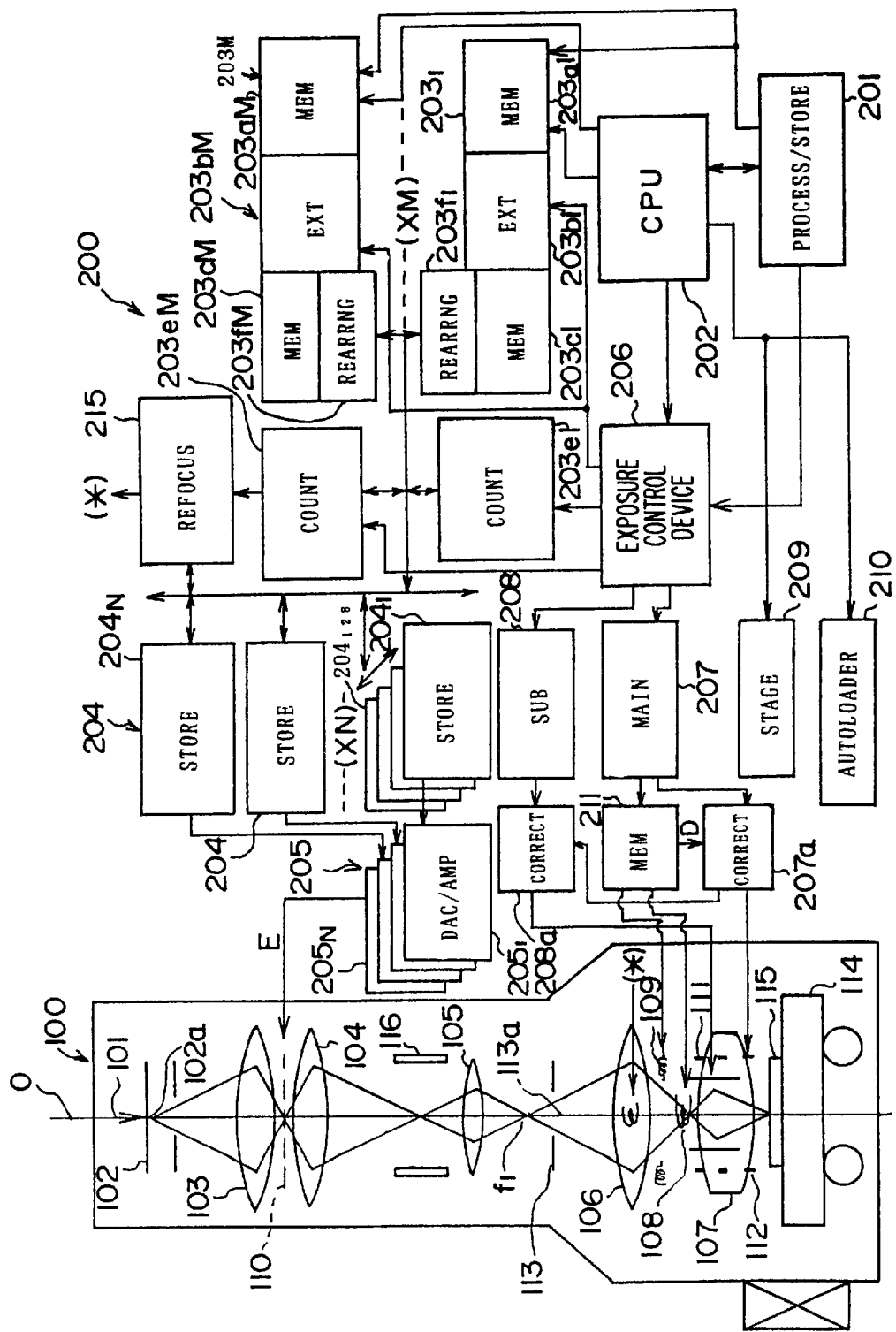
FIG. 19 is a block diagram of the structure of the overall charged-particle beam exposure system according to the embodiment of the present invention.

FIG. 19 is a block diagram of the detail of an electron beam exposure system of the blanking aperture array type shown in FIG. 17 or FIG. 18. The exposure system shown in FIG. 19 is made up of an electro-optic system 100 for forming an electron beam and focusing them, and a control system 200 for controlling the electro-optic system 100. The electro-optic system 100 includes an electron gun 101 functioning as an electron beam source. The electron gun 101 emits the electron beam along a predetermined optical axis o.

The electron beam emitted from the electron gun 101 is shaped by a beam shaping aperture 102a formed in an aperture plate 102. The aperture 102a is formed so as to match the optical axis o, and shapes the electron beam to have a rectangular cross section.

The shaped electron beam is projected onto a BAA mask 110 having blanking aperture array (BAA) by means of an electron lens 103. The lens 103 projects an image of the above-mentioned aperture onto the BAA mask 110. On the BAA mask 110, formed are a plurality of fine apertures corresponding to an exposure of a large number of dots to be drawn on a semiconductor substrate. An electrostatic deflector is provided to each aperture of the BAA mask 110. The electrostatic deflectors are controlled by driving signals E and allow the electron beams to pass therethrough in an unexcited state. The electrostatic deflectors deflect the electron beams in the excited state, so that the electron beams diverge from the optical axis o, and do not reach the above semiconductor substrate due to blanking by a round aperture plate 113. As a result, an exposure dot pattern corresponding to the apertures in the unexcited state are formed on the semiconductor substrate.

The electron beams passing through the BAA mask 110 pass through electron lenses 104 and 105, which form a reduction optical system, and are focused at a focal point f1 on the optical axis o. The electron beams passing through the selected apertures form an image at the focal point f1 and form a crossover image on a round aperture 113a of the round aperture plate 113. Then, the electron beams pass through the round aperture 113a of the round aperture plate 113, and are focused by means of electron lenses 106 and 107 serving as another reduction system, on a semiconductor substrate 115 placed on a movable stage 114. In this manner, an image of the BAA mask 110 is formed on the semiconductor substrate 115. The electron lens 107 functions as an objective lens, and includes a dynamic focus correction coil 108 and an astigmatic aberration correction coil 109, and deflectors 111 and 112 for moving the electron beams on the semiconductor substrate 115.

An electrostatic deflector 116 is provided between the lens 104 and the lens 105. The route of the electron beams is shifted out of the optical axis o passing through the round aperture 113a of the round aperture plate 113 by driving the deflector 116. When the exposure is not performed, the electron beams are completely cut off on the semiconductor substrate 115. The electron beams deflected by the excitation of the electrostatic deflector on the apertures of the BAA mask 110 are shifted out of the round aperture 113a, and do not reach the semiconductor substrate 115. In this manner, the exposure of the dot pattern on the semiconductor substrate 115 can be controlled.

In order to control the whole exposure operation, the electron beam exposure apparatus shown in FIG. 19 includes a control system 200, which is connected to a data process/storage device 201 including the aforementioned data processing computer 32 shown in FIG. 17 or FIG. 18 as well as a data process/storage device 201.

The pattern data output by the data process/storage device 201 is sent to buffer memories 203$a$1 through 203$a$M of M circuits 203$_1$ through 203$_M$ (M=1, 2, . . . ), from which the pattern data is read and output to data extension circuits 203$b$1 through 203$b$M (which corresponds to the data extension device 42 shown in FIGS. 17 and 18). The circuits 203 decompress the compressed data, and produce therefrom exposure dot data which turns ON/OFF the apertures of the BAA mask 110 in accordance with the exposure pattern. In order to make it possible to finely correct the exposure pattern, the electron beam exposure apparatus shown in FIG. 19 is configured so that each exposure point on the semiconductor substrate 115 is exposed N times (N=1, 2, . . . ) in an overlapping formation by independent exposure patterns, as will be described later. The data extension is carried out by M data extension circuits 203$b$1 through 203$b$M, which perform extension of the next exposure data during the time when the current exposure data is processed. Hence, the data processing can be carried out with a margin. Each of the data extension circuits 203$b$1 through 203$b$M can process N channels, and data equal to N channels is output to BAA data storage/output units 204 of N channels. Each of the circuits 2031 through 203M produces, on the basis of the exposure data supplied from the data process/storage device 201, N independent exposure dot pattern data used for the N-times overlapping exposure.

More particularly, each of the circuits 203$_1$ through 203$_M$ includes buffer memory 203$a$, data extension unit 203$b$, canvas memory 203$c$ and a rearrangement circuit 203$f$. The buffer memory 203$a$ stores exposure data supplied from the device 201. The data extension unit 203$b$ produces dot pattern data indicating an exposure dot pattern from the exposure data stored in the buffer memory 203$a$. The canvas memory 203$c$ performs an extension operation in cooperation with the data extension unit 203$b$. The data extension circuit 203$b$ and the canvas memory 203$c$ produce dot pattern data. The rearrangement circuit 203$f$ performs the rearrangement operation which has been described with reference to FIG. 15, and outputs the rearrangement data to BAA data storage/output circuits 204, which includes circuits 204$_1$ through 204$_N$. Each of the circuits 204$_1$ through 204$_N$, for example, circuit 204$_1$ includes 128 circuits 204$_1$ through 204$_{128}$ relating to 128 apertures arranged on the BAA mask 110 in the X direction. Each of the 128 circuits 204$_1$ through 204$_N$ is supplied, from the canvas memory 203$c$, with one-bit data used to turn ON or OFF the corresponding aperture among the 128 apertures of the BAA mask 110, and stores the received one-bit data. Further, the one-bit data from the circuits 204$_1$ through 204$_N$ are converted by D/A converters with amplifiers (DAC/AMP) 205$_1$ through 205$_N$, and are supplied to the BAA mask 110. The electrostatic deflectors arranged in the Y direction of the BAA mask 110 are driven by the data from the D/A converters 205$_1$ through 205$_N$.

Further, the exposure apparatus shown in FIG. 19 is equipped with an exposure control device 206 (which corresponds to the exposure apparatus control/operation device 34 shown in FIG. 17 or FIG. 18). The device 206, supplied with control signals from a CPU 202 in accordance with control programs, controls the circuits 203$_1$ through 203$_M$ and the circuits 204$_1$ through 204$_N$, transfers of data from the circuits 203$_1$ through 203$_M$ to the circuits 204$_1$ through 204$_N$, and driving of the BAA mask 110 by means of the D/A converters 205. Further, the exposure apparatus shown in FIG. 19 includes a main deflector 111 and a sub deflector 112 by means of a main deflector control circuit 207, a correction circuit 207$a$, a sub deflector control circuit 208 and a correction circuit 208$a$ so that the electron beams are scanned on the semiconductor substrate 115.

A memory 211 receiving, as an address, the main deflection amount data from the main deflector control circuit 207 outputs related correction operation factors GX, GY (gain), RX, RY (rotation), OX, OY (offset) and HX and HY (trapezoid) to a correction circuit 208$a$. The correction circuit 208$a$ corrects the sub deflection amount data by these correction factors, and outputs corrected sub deflection amount data to the sub deflector 112. Further, the memory 211 receives the main deflection amount data as an address, and outputs related correction operation factors DX, DY (deformation) to a correction circuit 207$a$. The correction circuit 207$a$ corrects the main deflection amount data by the correction operation factors DX and DY, and outputs the corrected main deflection amount data to the main deflector 111. Further, the memory 211 stores dynamic stig data SX and SY as well as dynamic focus data F, which data are used to control the correction coils 109 and 108.

In order to prevent spread of the beams caused by the coulomb interaction force when focusing the electron beams, the apparatus shown in FIG. 19 is equipped with ON-bit counter circuits 203$e$1 through 203$e$M for use in refocusing. The circuits 203$e$1 through 203$e$M performs a data extension in order to perform refocusing and calculates the number of ON bits, which is stored in a refocus data storage unit 215. A refocus coil indicated by "*" is driven by the refocus data stored in the refocus data storage unit 215.

Figure 20:
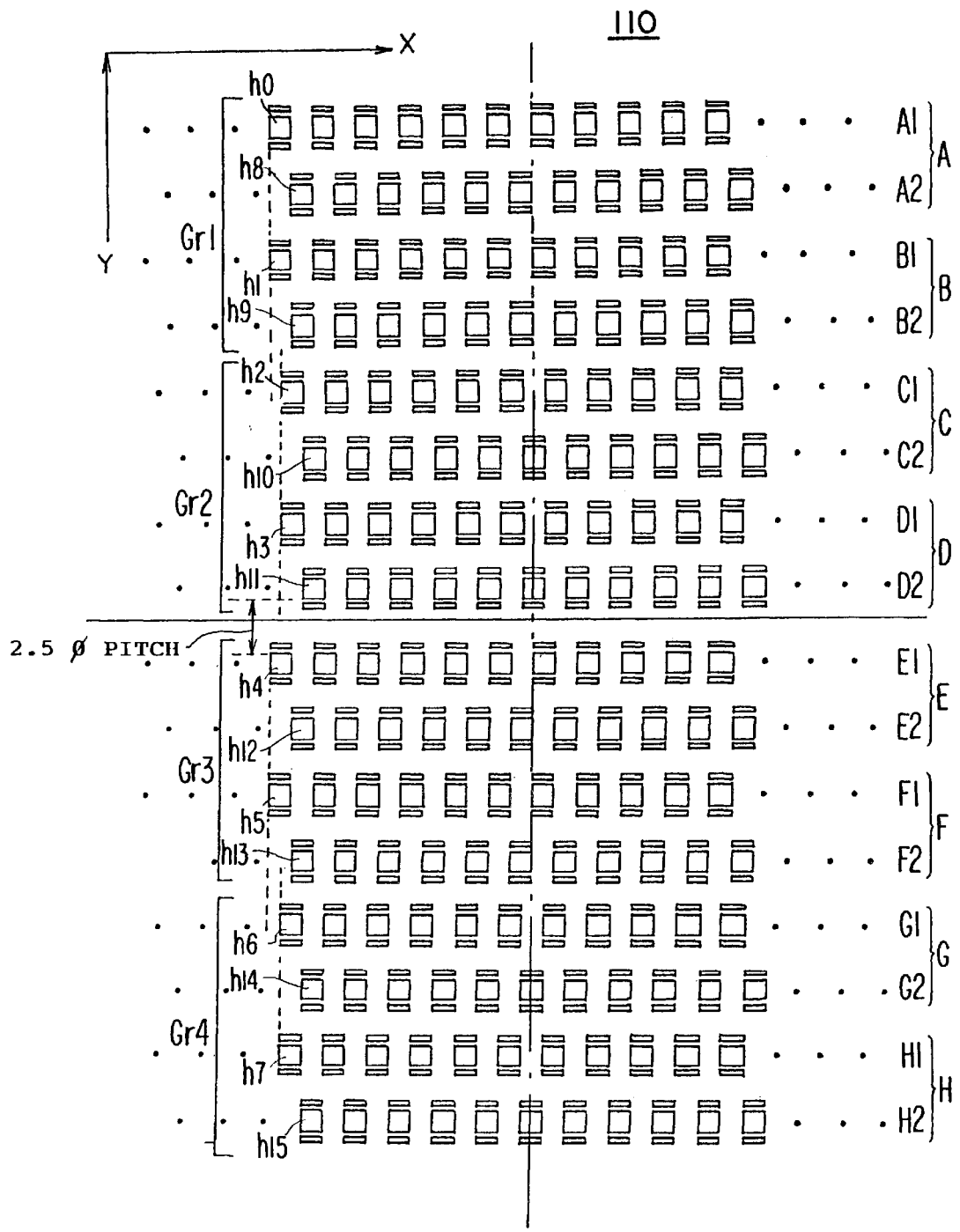
FIG. 20 is a plan view of a blanking aperture array used in the exposure system shown in FIG. 19.

A description will now be given of the structure of the BAA mask 110 with reference to FIG. 20. The BAA mask 110 has groups Gr.1, Gr.2, Gr.3 and Gr.4. Symbols h0–15 denote apertures. The holes h0–h7 are arranged in a column different from that in which the holes h8–h15 are arranged. One column consists of eight apertures, and the BAA mask 110 has 128 columns. Hence, the BAA mask 110 has 1024 apertures in total. The position exposed by the aperture h1 located in row A1 can be overwritten by the apertures h1–h7 eight times at most. A BAA mask used in a simple system has the apertures h0–h7 and h8–h15 arranged in a line. Meanwhile the BAA mask 110 shown in FIG. 20 has an advanced arrangement having the following features. The group Gr.2 is shifted to the group Gr.1 in the X direction by ½ pitch. The group Gr.3 is shifted to the group Gr.1 in the –Y direction by ½ pitch. The group Gr.4 is shifted to the group Gr.1 in the X and –Y directions by ½ pitch. Independent data is applied to the groups Gr.1–Gr.4. With the above structure, it is possible to increase the precision of the pattern position and perform the precise correction of the proximity effect. The operation in which the above process is carried out one time is equivalent to a process in which exposure is carried out four times in the multiple formation.

For example, data applied to the aperture h0 is applied to the aperture h1 at a delayed timing at which the exposure by the aperture h0 has been performed. The hole h2 is supplied with data different from that applied to the hole h0 at a delayed timing at which the exposure by the aperture h0 has been performed. In the same manner as described above, the apertures up to the aperture h7 are processed.

It is also possible to apply independent data to the eight apertures of the same column, all of which are mutually shifted. It is also possible to apply two groups of data to the eight apertures, all of which are mutually shifted. It is possible to arrange the apertures of the same column so that these aperture are mutually shifted at a pitch N/M, where N is the number of columns and M is the number of apertures.

As described above, data applied to the apertures h0–h7 does not have relation to data applied to the apertures h8–h15. The rows A1 and A2, B1 and B2 and so on are mutually shifted on the time base so that spaces which cannot be exposed by the rows A1 and B1 are exposed by the rows A2 and B2.

The description of the embodiments of the present invention being considered are now completed. The size of the cell stripes is not limited to 10 μm x×100 μm. The size of the cell area is not limited to the aforementioned size, and may be equal to a size deflectable in both the X and Y directions by means of the sub deflectors. The present invention is not limited to the blanking aperture array type but includes exposure systems of different types.

The present invention is not limited to the specifically disclosed embodiments, and variations and modifications may be made without departing from the scope of the present invention.

What is claimed is:

1. An exposure method of a multi-beam type in which a stage mounting an object to be exposed is continuously moved in a first direction, and charged-particle beams are controlled so as to form a desired beam shape as a whole, and in which a pattern is formed on the object by deflecting the charged-particle beams by a main deflector and a sub deflector, the charged-particle beams exposing an exposure field including both a main field and subfields, said exposure method comprising the steps of:
   (a) dividing a subfield into cell stripes corresponding to rectangular areas which can be exposed by once raster-scanning by the sub deflector, each cell stripe having a corresponding pattern and being sized for the pattern so that different sized patterns have different sized cell stripes, cell stripes having the same pattern being grouped together so that said same pattern commonly corresponds to each of the grouped cell stripes, patterns being represented by pattern data;
   (b) storing the pattern data obtained for the cell stripes into a memory together with data indicating the correspondence of the patterns to the cell stripes;
   (c) sorting, in an exposure sequence, position data indicative of positions of the cell stripes together with address information concerning the memory in which the pattern data is stored, so that the main deflector deflects the charged-particle beams in a zigzag exposure sequence;
   (d) calculating deflection amount data relating to the main deflector and the sub deflector from the position data; and
   (e) drawing patterns on the object by using the pattern data and the deflection amount data.

2. The exposure method as claimed in claim 1, wherein the step (c) comprises the step of sorting the position data together with the address information for each cell area equal to or less than a width corresponding to an area deflectable in a second direction substantially orthogonal to the first direction by means of the main deflector.

3. The exposure method as claimed in claim 2, wherein a width of the cell area in the first direction corresponds to a size of a chip to be exposed on a sample.

4. The exposure method as claimed in claim 2, wherein widths of the cell area in the first and second directions correspond to a field deflectable by the main deflector.

5. The exposure method as claimed in claim 2, wherein the step (d) comprises the steps of:
   (d-1) calculating main deflection amount data necessary to deflect the charged-particle beams to a center of each sub deflection field; and
   (d-2) calculating sub deflection data necessary to deflect the charged-particle beams to each cell stripe from a position determined by the main deflection amount data.

6. The exposure method as claimed in claim 1, wherein, with respect to patterns having a repetition, the step (a) changes sizes of the cell stripes in accordance with a pitch of repetition of said patterns.

7. The exposure method as claimed in claim 1, wherein the step (c) comprises the step of sorting the position data together with the address information so that the cell stripes are sequentially scanned by the charged-particle beams moved in the first direction while being shifted in a zigzag formation in a second direction substantially orthogonal to the first direction within a cell area equal to or less than a width corresponding to an area deflectable in the second direction by means of the main deflector and are moved in the first direction.

8. The exposure method as claimed in claim 1, wherein the step (c) comprises the steps of:
   (c-1) sorting the position data for each cell area equal to or less than a width corresponding to an area deflectable in a second direction substantially orthogonal to the first direction by means of the main deflector; and
   (c-2) sorting the position data according to values of the position data in the second direction.

9. The exposure method as claimed in claim 1, wherein the step (a) allows an overlap of cell stripes.

10. The exposure method as claimed in claim 1, wherein patterns having no repetition correspond to a cell stripe having a predetermined fixed size.

11. The exposure method as claimed in claim 1, wherein the step (a) comprises the step of setting a cell stripe with respect to an overlapping portion in which at least two of a first pattern having a repetition, a second pattern having a repetition having a repetition pitch different from that of the first pattern, and a third pattern having no repetition overlap each other.

12. The exposure method as claimed in claim 1, wherein the step (d) comprises the step of calculating all deflection amount data before drawing patterns on a sample in the step (e).

13. The exposure method as claimed in claim 1, wherein the step (d) comprises the step of calculating deflection amount data relating to a pattern to be drawn when another pattern is being drawn in the step (e).

14. The exposure method as claimed in claim 1, wherein the step (e) comprises the step of producing dot data from the pattern data and outputting the dot data to a blanking aperture array.

15. An exposure system of a multi-beam type in which a stage mounting an object to be exposed is continuously moved in a first direction, and charged-particle beams are controlled so as to form a desired beam shape as a whole, and in which a pattern is formed on the object by deflecting the charged-particle beams by a main deflector and a sub deflector, the charged-particle beams exposing an exposure field including a main field and subfields, said exposure system comprising:
   first means for dividing a subfield into cell stripes corresponding to rectangular areas which can be exposed by once raster-scanning the sub deflector, each cell stripe having a corresponding pattern and being sized for the pattern so that different sized pattern have different sized cell stripes, cell stripes having the same pattern being grouped together so that said same pattern commonly corresponds to each of the grouped cell stripes, patterns being represented by pattern data;

second means for storing the pattern data obtained for the cell stripes into a memory together with data indicating the correspondence of the patterns to the cell stripes;

third means for sorting, in an exposure sequence, position data indicative of positions of the cell stripes together with address information concerning the memory in which the pattern data is stored, so that the main deflector deflects the charged-particle beams in a zigzag exposure sequence;

fourth means for calculating deflection amount data relating to the main deflector and the sub deflector from the position data; and fifth means for drawing patterns on the object by using the pattern data and the deflection amount data.

16. The exposure system as claimed in claim 15, wherein the third means comprises means for sorting the position data together with the address information for each cell area equal to or less than a width corresponding to an area deflectable in a second direction substantially orthogonal to the first direction by means of the main deflector.

17. The exposure system as claimed in claim 16, wherein a width of the cell area in the first direction corresponds to a size of a chip to be exposed on a sample.

18. The exposure system as claimed in claim 16, wherein widths of the cell area in the first and second directions correspond to a field deflectable by the main deflector.

19. The exposure system as claimed in claim 16, wherein the fourth means comprises:

means for calculating main deflection amount data necessary to deflect the charged-particle beams to a center of each sub deflection field; and means for calculating sub deflection data necessary to deflect the charged-particle beams to each cell stripe from a position determined by the main deflection amount data.

20. The exposure system as claimed in claim 15, wherein, with respect to patterns having a repetition, the first means changes sizes of the cell stripes in accordance with a pitch of repetition of said patterns.

21. The exposure system as claimed in claim 15, wherein the third means comprises means for sorting the position data together with the address information so that the cell stripes are sequentially scanned by the charged-particle beams moved in the first direction while being shifted in a zigzag formation in a second direction substantially orthogonal to the first direction within a cell area equal to or less than a width corresponding to an area deflectable in the second direction by means of the main deflector and are moved in the first direction.

22. The exposure system as claimed in claim 15, wherein the third means comprises:

means for sorting the position data for each cell area equal to or less than a width corresponding to an area deflectable in a second direction substantially orthogonal to the first direction by means of the main deflector; and means for sorting the position data according to values of the position data in the second direction.

23. The exposure system as claimed in claim 15, wherein the first means allows an overlap of cell stripes.

24. The exposure system as claimed in claim 15, wherein the first means comprises means for corresponding patterns having no repetition to a cell stripe having a predetermined fixed size.

25. The exposure system as claimed in claim 15, wherein the first means comprises means for setting a cell stripe with respect to an overlapping portion in which at least two of a first pattern having a repetition, a second pattern having a repetition having a repetition pitch different from that of the first pattern, and a third pattern having no repetition overlap each other.

26. The exposure system as claimed in claim 15, wherein the fourth means comprises means for calculating all deflection amount data before drawing patterns on a sample in the fifth means.

27. The exposure system as claimed in claim 15, wherein the fourth means comprises means for calculating deflection amount data relating to a pattern to be drawn when another pattern is being drawn in the fifth means.

28. The exposure system as claimed in claim 15, wherein the fifth means comprises means for producing dot data from the pattern data and outputting the dot data to a blanking aperture array.

29. An exposure system of a multi-beam type in which a stage mounting an object to be exposed is continuously moved in a first direction, and charged-particle beams are controlled so as to form a desired beam shape as a whole, and in which a pattern is formed on the object by deflecting the charged-particle beams by a main deflector and a sub deflector, the charged-particle beams exposing an exposure field including a main field and subfields, said exposure system comprising:

an electronic circuit to divide a subfield into cell stripes corresponding to rectangular areas which can be exposed by once raster-scanning the sub deflector, each cell stripe having a corresponding pattern and being sized for the pattern so that different sized patterns have different sized cell stripes, cell strips having the same pattern being grouped together so that said same pattern commonly corresponds to each of the grouped cell stripes, patterns being represented by pattern data;

a memory to store the pattern data obtained for the cell stripes together with data indicating the correspondence of the patterns to the cell stripes;

a sorter to sort, in an exposure sequence, position data indicative of positions of the cell stripes together with address information concerning the memory in which the pattern data is stored, so that the main deflector deflects the charged-particle beams in a zigzag exposure sequence;

a second electronic circuit to calculate deflection amount data relating to the main deflector and the sub deflector from the position data; and an apparatus to draw patterns on the object by using the pattern data and the deflection amount data.

30. A method comprising:

dividing a subfield of a charged particle beam exposure field into cell stripes, each cell stripe having a corresponding pattern and being sized for the pattern so that different sized patterns have different sized cell stripes, cell stripes having the same pattern being grouped together so that said same pattern commonly corresponds to each of the grouped cell stripes; and deflecting a charged particle beam by a main deflector and a sub deflector to draw the patterns on an object in accordance with the correspondence of the patterns to the cell stripes.

31. An apparatus comprising:

a subfield divider dividing a subfield of a charged particle beam exposure field into cell stripes, each cell stripe having a corresponding pattern and being sized for the pattern so that different sized patterns have different sized cell stripes, cell stripes having the same pattern being grouped together so that said same pattern commonly corresponds to each of the grouped cell stripes; and a deflector deflecting a charged particle beam by a main deflector and a sub deflector to draw the patterns on an object in accordance with the correspondence of the patterns to the cell stripes.

32. An apparatus comprising:

means for dividing a subfield of a charged particle beam exposure field into cell stripes, each cell stripe having a corresponding pattern and being sized for the pattern so that different sized patterns have different sized cell stripes, cell stripes having the same pattern being grouped together so that said same pattern commonly corresponds to each of the grouped cell stripes; and means for deflecting a charged particle beam by a main deflector and a sub deflector to draw the patterns on an object in accordance with the correspondence of the patterns to the cell stripes.

* * * * *